United States Patent

Monte et al.

[11] Patent Number: 5,062,468
[45] Date of Patent: * Nov. 5, 1991

[54] MOLD AND METHOD FOR CASTING A SINGLE CRYSTAL METAL ARTICLE

[75] Inventors: Louis H. Monte, Minerva; Arunachalam Jeyarajan, Euclid; Lawrence D. Graham, Chagrin Falls, all of Ohio

[73] Assignee: PCC Airfoils, Inc., Cleveland, Ohio

[ * ] Notice: The portion of the term of this patent subsequent to Jul. 10, 2007 has been disclaimed.

[21] Appl. No.: 547,287

[22] Filed: Jul. 3, 1990

Related U.S. Application Data

[63] Continuation-in-part of Ser. No. 382,729, Jul. 19, 1989, Pat. No. 4,940,073, and a continuation-in-part of Ser. No. 542,436, Jun. 22, 1990.

[51] Int. Cl.$^5$ .............................................. B22C 9/04
[52] U.S. Cl. ................................. 164/122.2; 164/361
[58] Field of Search .................... 164/122.1, 122.2, 361

[56] References Cited

U.S. PATENT DOCUMENTS 3,739,835  6/1973  Copley et al. ................... 164/122.2
3,888,301  6/1975  Hayes ............................ 164/122.2
4,969,501 11/1990  Brokloff et al. ................. 164/122.1

Primary Examiner—Kuang Y. Lin
Attorney, Agent, or Firm—Tarolli, Sundheim & Covell

[57] ABSTRACT

A mold structure includes an article mold having a mold cavity with a configuration corresponding to the configuration of the article to be cast. A starter section contains a starter cavity in which a plurality of crystals form. A crystal selector has a passage which extends between an upper end of the starter cavity and a lower end of the article mold cavity. To promote the growth in the crystal selector passage of a crystal having primary and secondary orientations corresponding to selected primary and secondary orientations of the article, the crystal selector passage has a portion which slopes downwardly in the direction of solidification of metal along the crystal selector passage. Without the use of a seed crystal, the cast article will have a secondary orientation axis which is almost always within plus or minus 30 degrees of a selected secondary orientation axis. Through the use of a seed crystal, the secondary orientation axis of the cast article will correspond to the selected secondary orientation axis.

48 Claims, 6 Drawing Sheets

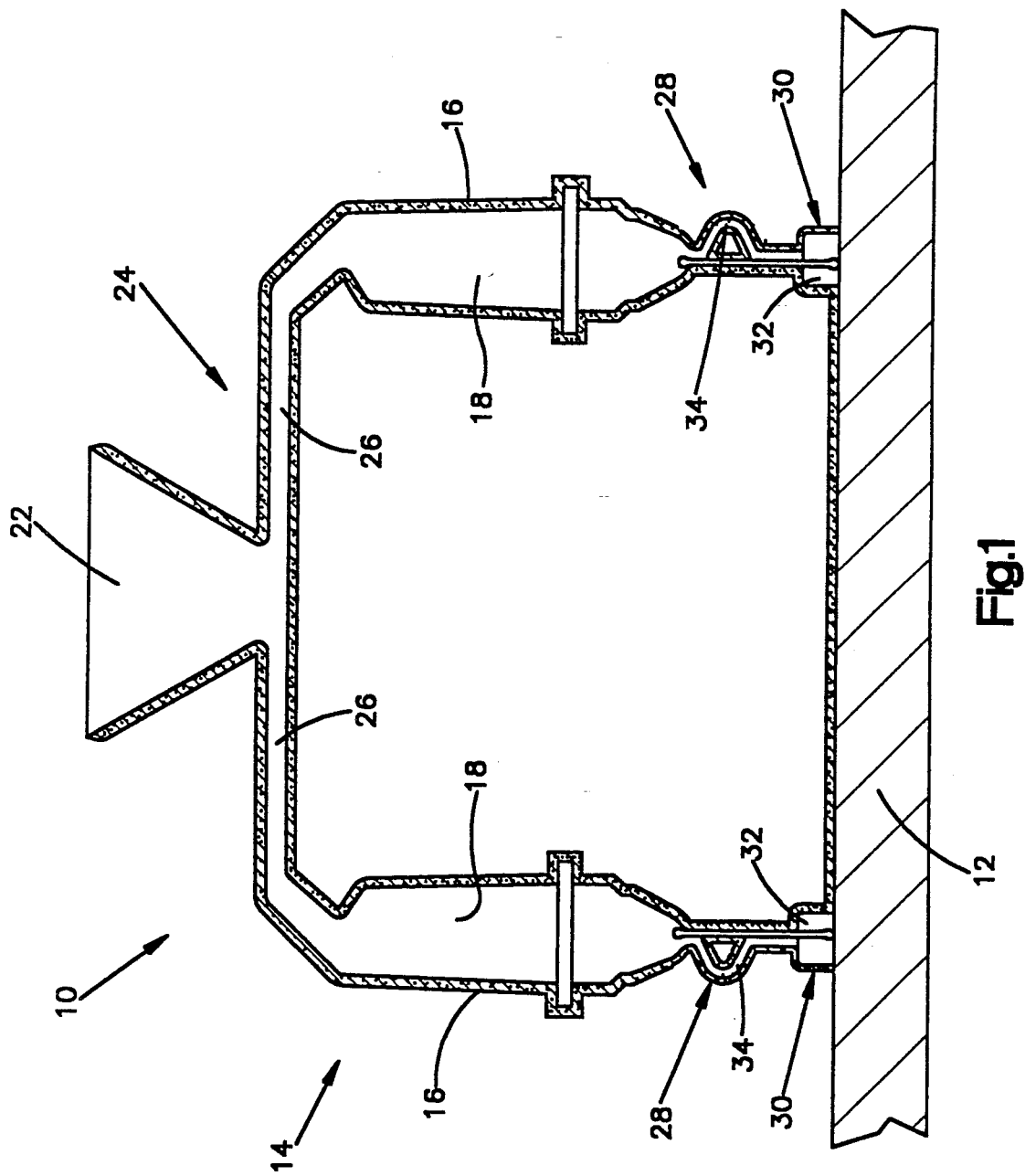

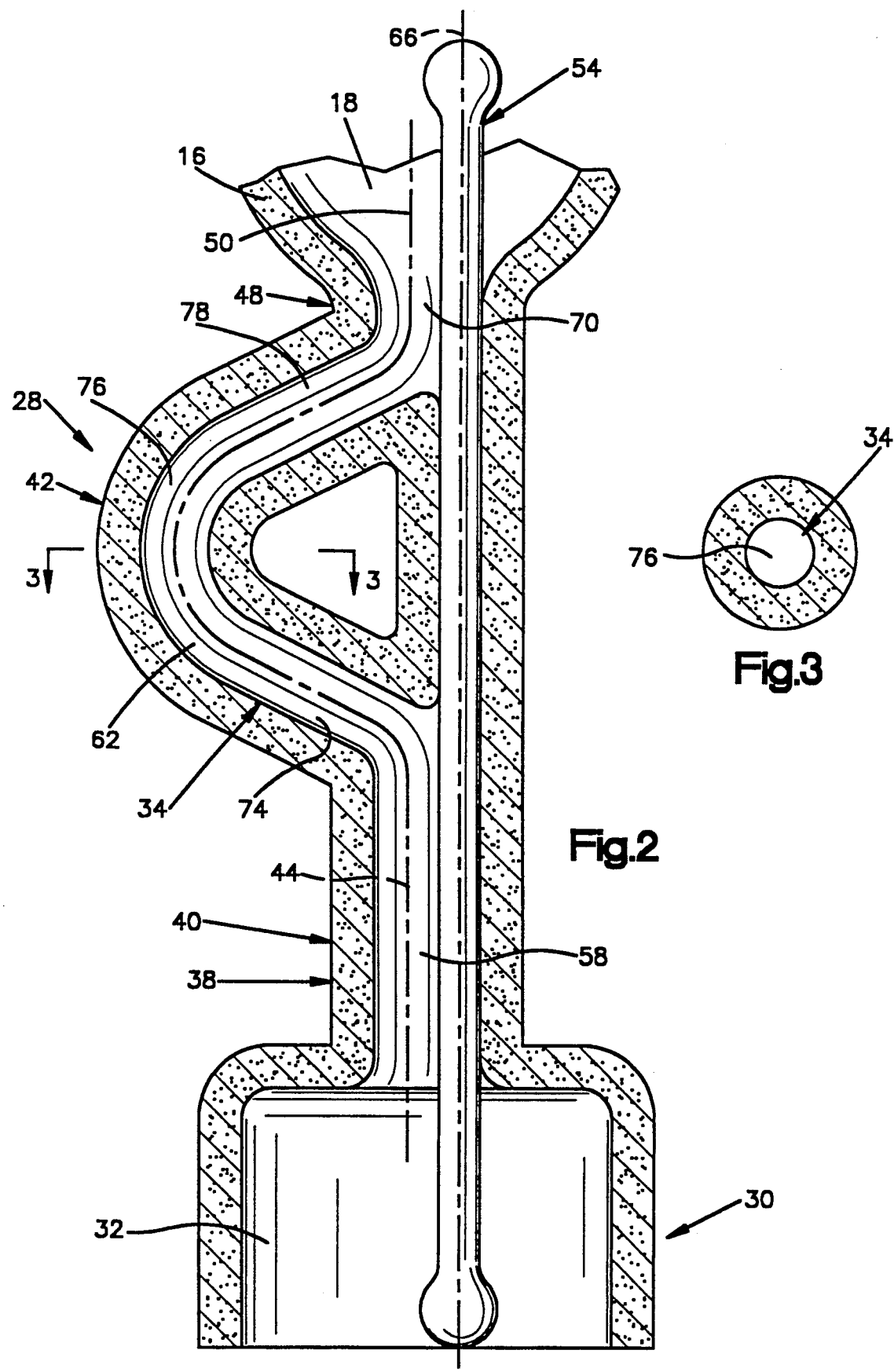

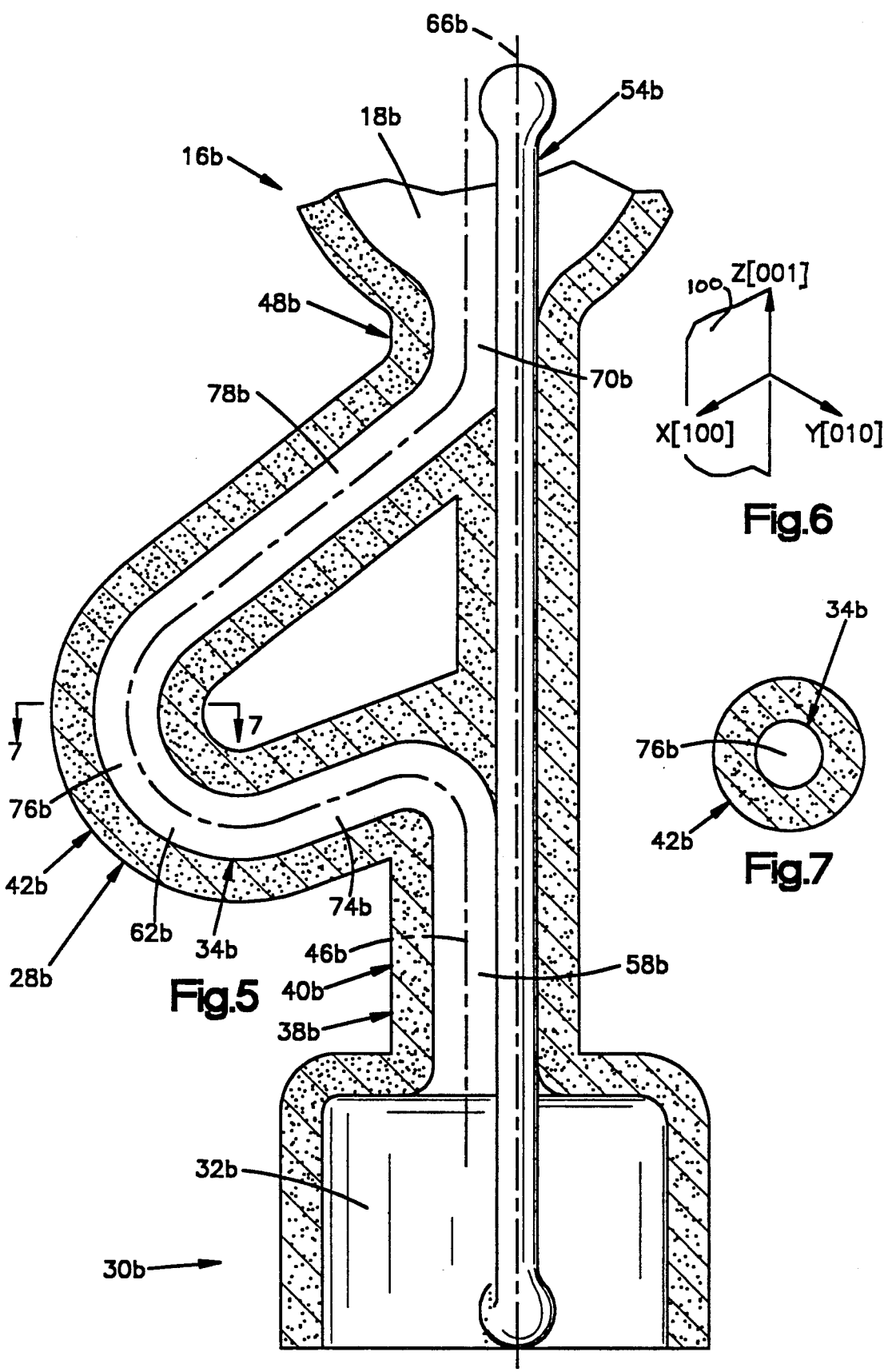

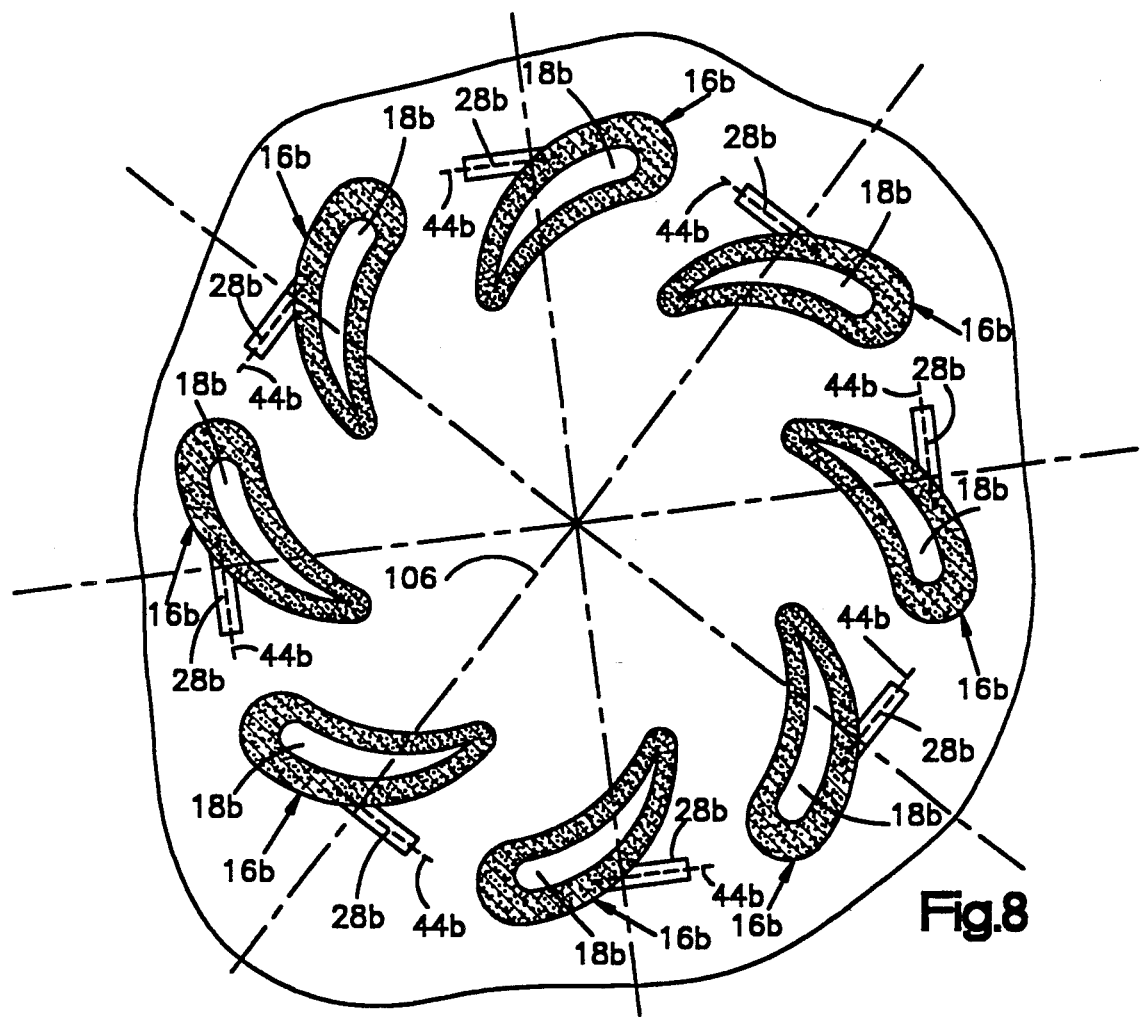
Fig.8
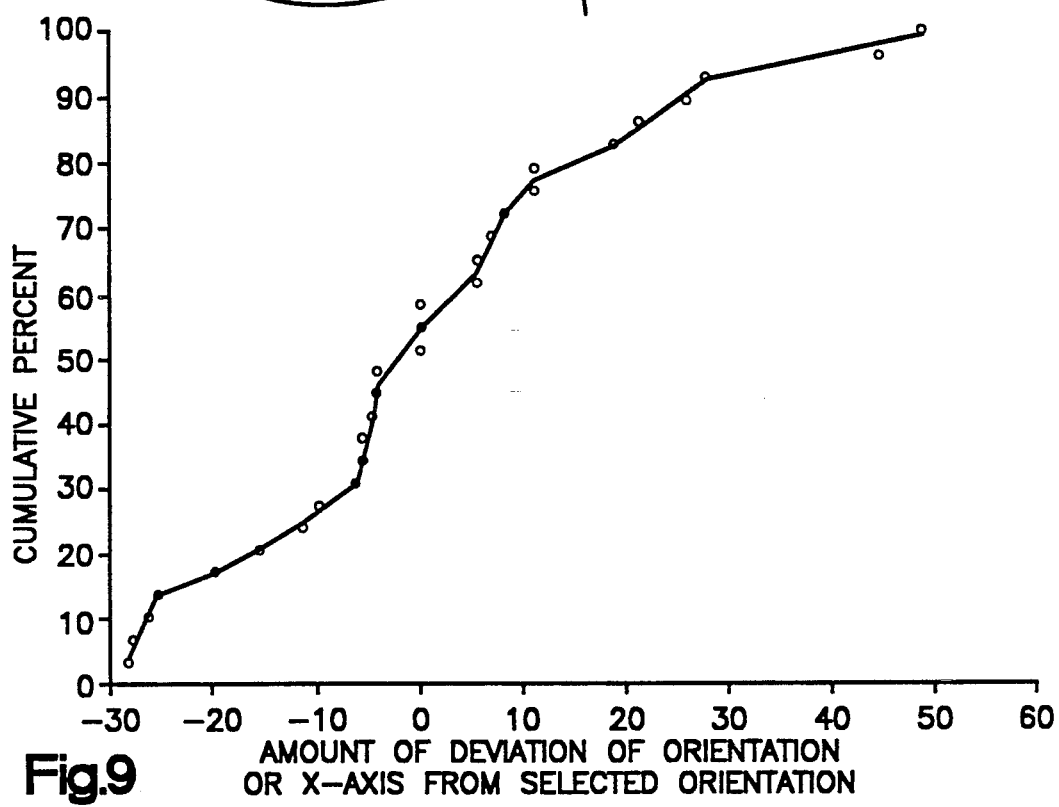
Fig.9   AMOUNT OF DEVIATION OF ORIENTATION
OR X—AXIS FROM SELECTED ORIENTATION

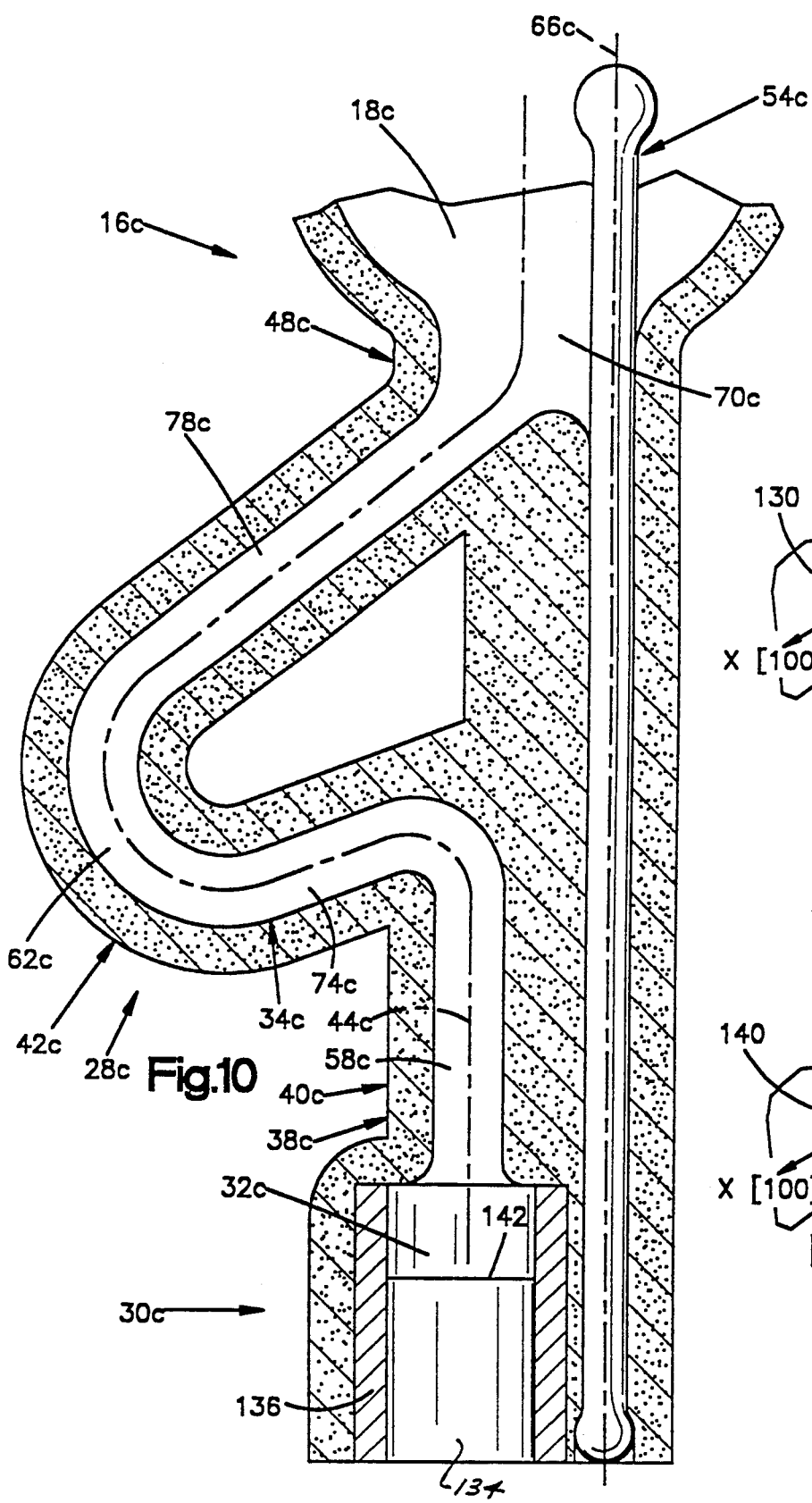
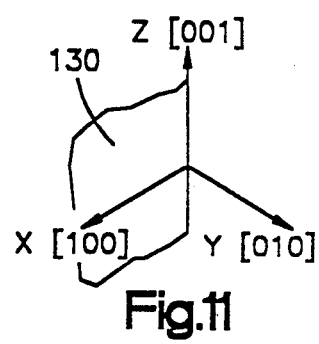
Fig.11
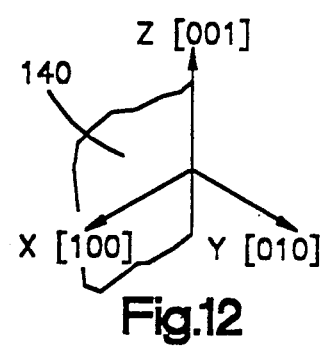
Fig.12

MOLD AND METHOD FOR CASTING A SINGLE CRYSTAL METAL ARTICLE

RELATED APPLICATION

This application is a continuation-in-part of U.S. patent application Ser. No. 07/382,729 filed July 19, 1989 and entitled "Mold for Casting a Single Crystal Metal Article", now U.S. Pat. No. 4,940,073. This application is also a continuation-in-part of U.S. patent application Ser. No. 07/542,436, filed June 22, 1990 and entitled "Mold and Method for Casting a Single Crystal Metal Article". The benefit of the earlier filing dates of application Ser. Nos. 07/382,729 and 07/542,436 for all common subject matter has been and hereby is claimed.

BACKGROUND OF THE INVENTION

The present invention relates to a mold and method which are used to cast a metal article as a single crystal.

Molds for casting single crystal metal articles have previously utilized helical crystal selectors of the so-called "pigtail" type. The casting of single crystal articles utilizing a helical selector is relatively expensive. This expense may be contributed to by a substantial scrap rate.

The molds for forming single crystal articles are commonly made by an investment or lost wax process. In this process of making a mold, a wax pattern is first formed. The wax pattern is covered with a layer of ceramic mold material. The wax pattern is removed from the layer of ceramic mold material to leave a space having a configuration corresponding to the configuration of the wax pattern. The forming of the wax pattern with a helical selector requires complicated tooling or an injection mold in which the wax pattern of the helical selector is formed. Single crystal molds having a helical selector are disclosed in U.S. Pat. Nos. 4,475,582 and 4,548,255. A helical selector having a central support element is disclosed in U.S. Pat. No. 4,180,119.

It is frequently desired to cast a doubly oriented single crystal metal article. Thus, the operating characteristics of a single crystal metal article may be enhanced when the article has selected primary and secondary orientations. The primary orientation of a single crystal article is along a primary or Z axis which corresponds to the [001] direction of crystal growth. The secondary orientation of the single crystal article may be along either an X or Y axis. The X axis corresponds to the [100] direction of crystal growth and the Y axis corresponds to the [010] direction of crystal growth.

Although known crystal selectors may tend to promote the growth of crystals having a secondary orientation which is a function of the configuration of the selector passage, the known crystal selectors have not been successful in obtaining doubly oriented single crystal articles, particularly on a production basis. It has previously been suggested that single crystal seeds having a known crystallographic orientation be used to cause molten metal to solidify as a cast article having a desired crystallographic orientation. When this is to be done, the seed crystal is accurately positioned with its primary and secondary orientations corresponding to the desired primary and secondary orientations of the article. Solidification of molten metal to form the article is initiated at the upper side surface of the seed crystal. This may result in the growth of a single crystal having an orientation corresponding to the crystallographic orientation of the seed crystal and the desired crystallographic orientation of the article.

Unfortunately, it is not uncommon for more than one crystal to be nucleated at or adjacent to the seed crystal. Spurious or unwanted nucleation of secondary crystals may be caused by contaminants or other imperfections which occur during casting, particularly during casting on a production basis. The extra or secondary crystals will usually have a random crystallographic orientation which is almost always different than the desired crystallographic orientation of the article to be cast. Therefore, it is important that the secondary or spurious crystals do not grow into the article mold cavity.

If the secondary or spurious crystals grow into the article mold cavity, they can result in the formation of an article which is not a single crystal article. Thus, the secondary crystals can result in the formation of an article which is composed of two or more crystals having different crystallographic orientations. The secondary crystals can also result in the formation of an article having a crystallographic orientation which is different than the desired crystallographic orientation.

In order to enable articles to be cast with the desired primary and secondary crystallographic orientations, it has been suggested that a crystal selector be used in combination with a seed crystal. Thus, U.S. Pat. No. 4,714,101 discloses the use of a straight vertical crystal selector to block the growth of crystals nucleated along the sides of a seed from entering an article mold cavity. In addition, U.S. Pat. No. 4,475,582 discloses the use of a helical or "pigtail" type crystal selector in combination with a seed crystal.

SUMMARY OF THE INVENTION

Molds constructed in accordance with the present invention may be utilized to cast single crystal metal articles with substantially all of the articles having selected primary orientation axes and secondary orientation axes which are within plus or minus 30 degrees of selected secondary orientation axes. This is accomplished without using seed crystals.

Due to the heat gradients established in a mold during withdrawal of the mold from a furnace chamber, the casting of a single crystal metal article with a selected primary orientation axis is relatively easily accomplished using a crystal selector without a seed crystal. However, the casting of a single crystal metal article with a secondary orientation axis which is within plus or minus 30 degrees of a selected secondary orientation axis previously required the use of a seed crystal.

The casting of single crystal metal articles with secondary orientation axes which are within plus or minus 30 degrees of selected secondary orientation axes is accomplished by having portions of a selector passages slope downwardly in the direction of solidification of metal along the selector passages. The downwardly sloping portion of each selector passage is hot enough to prevent the nucleation of new grains and is cool enough to have rapid grain growth along the downwardly sloping portion of the selector passage.

Due to the relatively rapid grain growth along the downwardly sloping portion of the selector passage, a grain or crystal which is most favorably oriented for growth along the downwardly sloping portion of the selector passage will quickly crowd out less favorably oriented grains. A crystal or grain which is most favorably oriented for growth along the downwardly sloping portion of the selector passage will have a vertical primary orientation axis. This most favored grain will also have a secondary orientation axis which is disposed in a vertical plane parallel to or close to parallel to a vertical plane containing a longitudinal central axis of the downwardly sloping portion of the selector passage.

The downwardly sloping portion of the selector passage is located with its longitudinal central axis in a vertical plane which is parallel to a vertical plane containing a selected or desired secondary orientation axis of a cast article. The grain or crystal most favored for growth along the downwardly sloping portion of the selector passage will have a secondary orientation axis which is in or close to the vertical plane containing the longitudinal axis of the downwardly sloping portion of the selector passage. Therefore, the secondary orientation axis of the crystal most favored for growth along the downwardly sloping portion of the selector passage will be parallel to or close to parallel to the selected secondary orientation axis of the cast article.

In one specific embodiment of the invention, a mold structure included a plurality of article molds which were disposed in a circular array. Each of the article molds had crystal selectors which extended transversely to vertical radial planes through article mold cavities of the various article molds. The specific crystal selectors included a single bend portion which was disposed at one side of a vertical radial plane through the article mold.

In order to cast single crystal articles having secondary orientation axes which are very close to selected secondary orientation axes, a seed crystal may be utilized. Thus, the improved single crystal selector of the present invention can be used to cast single crystal articles with secondary orientation axes which are within plus or minus 30 degrees of selected secondary orientation axes without resorting to the use of seed crystals. However, when it is desired to cast only single crystal articles having secondary orientation axes which almost exactly correspond to selected secondary orientation axes for the articles, seed crystals are utilized. The seed crystals are placed in starter sections of the molds with the primary orientation axes of the seed crystals parallel to the selected primary orientation axes of the cast articles, that is, usually vertical. Secondary orientation axes of the seed crystals are located parallel to the selected secondary orientation axes of the single crystal articles.

Accordingly, it is an object of this invention to provide a new and improved mold and method for use in casting a single crystal article and wherein an improved crystal selector has a passage with a portion which slopes downwardly in the direction of solidification of metal along the selector passage.

Another object of this invention is to provide a new and improved crystal selector and method which enable a plurality of single crystal metal articles to be cast with substantially all of the articles having secondary orientation axes which are within plus or minus 30 degrees of selected secondary orientation axes without the use of seed crystals.

BRIEF DESCRIPTION OF THE DRAWINGS

The foregoing and other objects and features of the present invention will become more apparent upon a consideration of the following description taken in connection with the accompanying drawings, wherein:

FIG. 1 is a schematic illustration depicting the manner in which a mold structure is supported on a chill plate prior to pouring of molten metal in the mold structure;

FIG. 2 is an enlarged sectional view of a single crystal selector used in the mold structure of FIG. 1;

FIG. 3 is a sectional view, taken generally along the line 3—3 of FIG. 2, illustrating the cross sectional configuration of a bend portion of a passage in the single crystal selector;

FIG. 5 is an enlarged sectional view of an improved single crystal selector which may be used in a mold structure, similar to the mold structure of FIG. 1, to cast a single crystal metal article having a selected primary orientation axis and a secondary orientation axis which is within plus or minus 30 degrees of a selected secondary orientation axis;

FIG. 6 is a schematic illustration depicting the selected primary and secondary crystallographic orientations for an article to be cast in an article mold cavity with the improved single crystal selector of FIG. 5;

FIG. 7 is a sectional view taken generally along the line 7—7 of FIG. 5, illustrating the cross sectional configuration of a bend portion of a passage in the single crystal selector;

FIG. 8 is a schematic illustration depicting the orientation of crystal selectors, having the construction shown in FIG. 5, relative to article molds;

FIG. 9 is a graph depicting the manner in which substantially all of the articles cast with the single crystal selector of FIG. 5 have a secondary orientation axis which is within plus or minus 30 degrees of a selected secondary orientation axis;

FIG. 10 is an enlarged sectional view illustrating the use of the single crystal selector of FIG. 5 with a seed crystal;

FIG. 11 is a schematic illustration depicting the selected primary and secondary crystallographic orientations for an article to be cast in an article mold cavity with the selector and single crystal seed of FIG. 10; and FIG. 12 is a schematic illustration depicting the primary and secondary crystallographic orientations for the seed crystal used with the selector of FIG. 10.

DESCRIPTION OF SPECIFIC PREFERRED EMBODIMENTS OF THE INVENTION

Mold Structure

Figure 4:
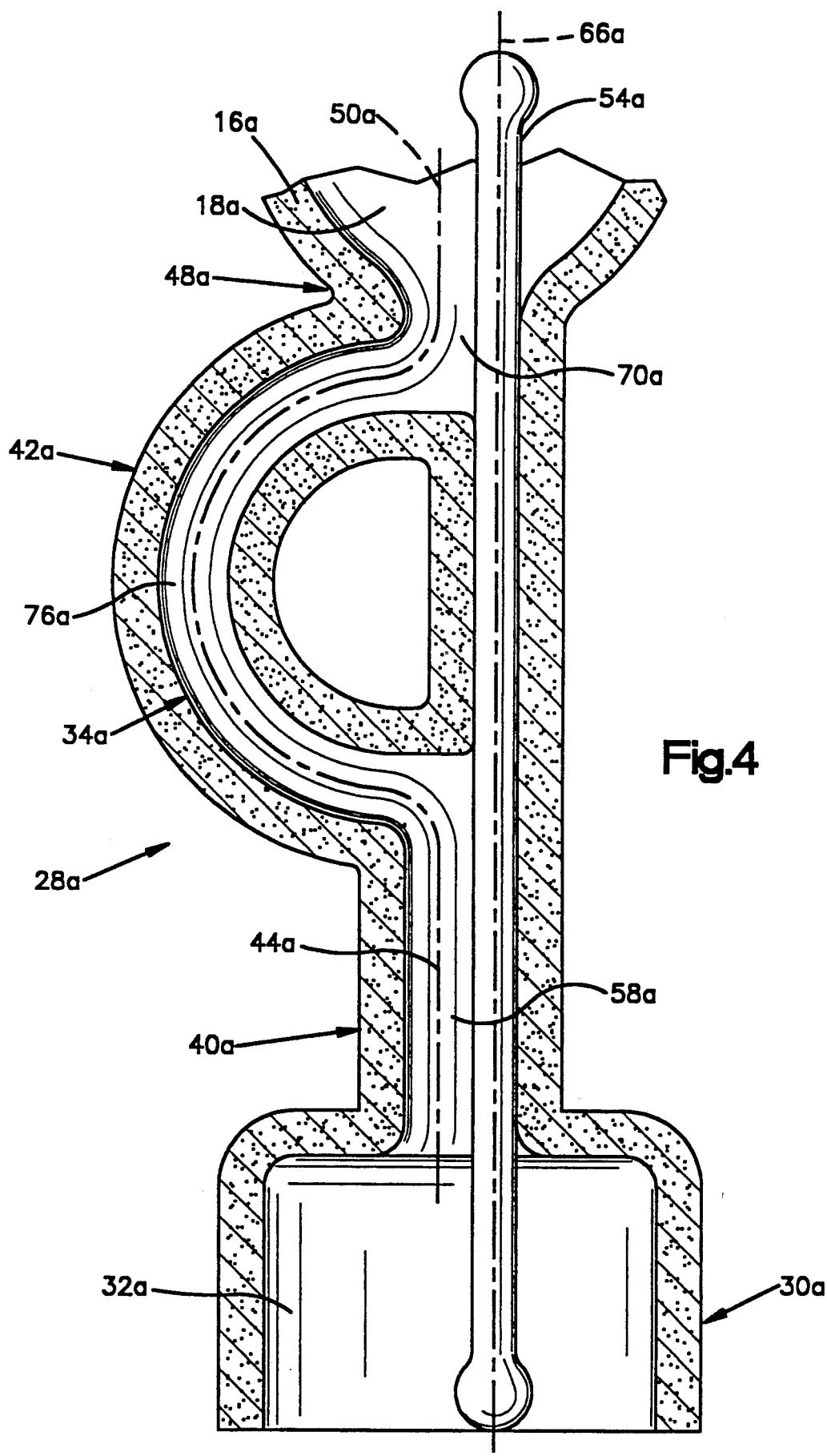
FIG. 4 is an enlarged sectional view, generally similar to FIG. 2, of a second embodiment of the crystal selector.

A mold structure 10 is illustrated in FIG. 1 on a chill plate 12. The mold structure 10 includes an annular array 14 of article molds 16. The article molds 16 have mold cavities 18 with configurations corresponding to the configuration of single crystal articles to be cast in the mold structure 10. It should be understood that although only a pair of article molds 16 have been illustrated in FIG. 1, the mold structure 10 includes additional article molds which have not been illustrated but which each have the same construction as the illustrated article molds.

Molten metal is conducted from a pour cup 22 to the article mold cavities 18 through a gating system 24. The gating system 24 includes a plurality of passages or runners 26 which extend outwardly from the bottom of the pour cup 22 to the upper end portions of the article mold cavities 18. The molten metal flows downwardly through the article mold cavities 18 and through a single crystal selector 28 to a starter 30.

In the embodiment of the invention illustrated in FIGS. 2 and 3, the starter 30 includes a generally cylindrical starter cavity 32 having an open lower end which is blocked by the chill plate 12. The molten metal solidifies in the starter cavity 32 of FIG. 2 as a plurality of elongated grains or crystals which extend upwardly from the chill plate 12 to the upper end of the starter cavity. A few of the grains of metal grow from the starter cavity 32 into a crystal selector passage 34 in the single crystal selector 28.

As the few grains which enter the crystal selector passage 34 continue to grow, the most favorably oriented grain or crystal grows at a greater rate than the other grains or crystals. Therefore, the most favorably oriented grain or crystal crowds out the less favorably oriented grains. This results in the single grain or crystal which is most favorably oriented growing from the crystal selector passage 34 into the article mold cavity 18.

The single grain or crystal which emerges from the crystal selector passage 34 into the article mold cavity 18 solidifies to completely fill the article mold cavity. The single crystal of metal which solidifies in the article mold cavity 18 has a configuration which corresponds to a desired configuration of the article to be cast. The molten metal in the gating system 24 then solidifies. During solidification of the molten metal in the gating system, additional crystals may nucleate.

The one-piece mold structure 10 is formed of a ceramic material by what is frequently referred to as the lost wax process. In making the mold structure 10, a disposable pattern is first formed. The disposable pattern has the same configuration as the interior of the mold structure 10. Thus, main portions of the disposable pattern have a configuration corresponding to the configuration of the article mold cavity 18. Other portions of the disposable pattern have configurations corresponding to the configuration of the starter cavity 32, the selector passage 34 and the gating system 24.

The specific configuration of the disposable pattern will depend upon the configuration of the article to be cast and the gating associated with the article. The disposable pattern may be formed of a natural or artificial wax, polystyrene or other material.

A wet coating of ceramic mold material is applied over the disposable pattern. The wet coating of ceramic mold material may be applied over the pattern by dipping, brushing, spraying or other methods. However, it is presently preferred to repetitively dip the pattern in a liquid slurry of ceramic mold material. Although many different types of slurry could be utilized, one illustrative slurry contains fused silica, zircon, or other refractory materials in combination with binders. A chemical binder such as ethyl silicate, sodium silicate and colloidal silica can be used. In addition, the slurry may contain suitable film formers, such as alginates, to control viscosity and wetting agents to control flow characteristics and pattern wettability.

In accordance with common practices, the initial slurry coating applied to the pattern may contain a very finely divided refractory material to produce an accurate surface finish. A typical slurry for a first coat may contain colloidal silica sol as the binder. Zircon or alumina of a particle size of 325 mesh or smaller as the refractory can be employed, together with less than one-tenth percent by weight of a wetting agent. After the application of the initial coating, the surface is stuccoed with refractory materials having particle sizes on the order of 60 to 200 mesh.

In accordance with well known procedures, each dip coating is dried in air at a temperature of approximately 24° C. before subsequent dipping. The pattern is repetitively dipped and dried enough times to build up a covering of a ceramic mold material of a desired thickness. For example, the pattern may be dipped fifteen times to build up a covering of a thickness of approximately 0.400 inches in order to prevent mold bulge.

The wax material of the pattern is then melted and removed from the mold. After dewaxing, the uncured mold structure is fired in an oxidizing atmosphere at a temperature of more than 540° C. for one hour to thoroughly cure the mold sections, burn any residual pattern material, and drive off any water. It is contemplated that the uncured mold sections may be fired in an oxidizing atmosphere at a temperature of approximately 1,038° C. for approximately one hour. Of course, the specific composition of the slurry of ceramic mold material, number of dip coatings, and firing temperature and time may vary depending upon the construction of the mold.

SINGLE CRYSTAL SELECTOR

The single crystal selector 28 has a one-piece ceramic wall, generally designated with the numeral 38 in FIG. 2, which is integrally formed with the starer 30 and article mold 16. The wall 38 is formed in the manner previously explained by covering a disposable crystal selector pattern with ceramic mold material.

The crystal selector 28 includes a lower section 40 which extends upwardly from the starter 30. The crystal selector 28 has a single bend section 42 which extends sidewardly and upwardly, first away from and then back toward a vertical axis 44 of the lower section 40. An upper section 48 extends upwardly from the single bend section 42. The upper section 48 is vertically aligned with the lower section 40 and is connected with the article mold wall 16. The upper section 48 has a vertical axis 50 which is coincident with the vertical axis 44 of the lower section 40.

A support element 54 extends straight upwardly from the lower section 40 to the upper section 48. The vertical support element 54 spans the space between opposite ends of the single bend section 42 to support the single bend section against the influence of vertical and/or sideward loading. The support element 54 is a cylindrical quartz rod. The cylindrical surface of the linear fused quartz rod has been roughened to promote adherence of the ceramic mold material to the quartz rod. In addition, beads or bulges are formed at opposite ends of the support element 54 to promote the adherence of wax pattern material to the support element during forming of the mold 10. If desired, the support element 54 could be made of a material other than fused quartz, for example, a suitable ceramic material.

The crystal selector passage 34 includes a linear, generally cylindrical, lower portion 58 with a vertical central axis 44. A lower end of the portion 58 of the selector passage 34 opens into the top of the starter cavity 32 at a location on the vertical central axis of the cylindrical starter cavity. The opposite or upper end of the straight lower portion 58 of the selector passage 34 opens into a single bend portion 62 of the selector passage.

Although a majority of the surface area of the vertical lower portion 58 of the selector passage 34 is formed by ceramic mold material, a vertical segment of the side surface of the support element 54 is exposed to the interior of the lower portion of the selector passage. Therefore, the surface of support element 54 forms a vertically extending part of the side wall of the lower portion of the selector passage. The support element 54 has a vertical central axis 66 which extends parallel to and is offset to one side of the central axis 44 of the lower portion 58 of the selector passage 34. The support element 54 has a circular cross section with the same diameter as a circular cross section of the lower portion 58 of the selector passage 34.

The single bend portion 62 of the selector passage 34 has a lower end which opens into the top of the lower portion 58 of the selector passage and an upper end which opens into an upper portion 70 of the selector passage 34. The single bend portion 62 of the selector passage 34 has an upwardly and outwardly inclined entrance ramp 74 which extends from the lower portion 58 of the selector passage to a single arcuate bend 76. The entrance ramp 74 is straight and is disposed in a plane containing the vertical central axis 44 of the lower portion 58 of the selector passage and the vertical central axis 66 of the support rod 54.

The single arcuate bend 76 of the selector passage 34 is formed as a portion of a circle and connects the entrance ramp 74 with a linear exit ramp 78. The arcuately curving central axis of the single bend 76 of the selector passage 34 is disposed in the same flat plane as the central axis of the entrance ramp 74, the central axis 44 of the lower section 40 and the central axis 66 of the support rod 54. The single arcuate bend 76 has a circular cross sectional configuration (FIG. 3) of the same diameter as the circular cross section of the entrance ramp 74. However, if desired, the diameter of the selector passage 34 can vary along its entire length.

The upwardly and inwardly inclined exit ramp 78 (FIG. 2) of the selector passage 34 has a lower end which is connected with the single arcuate bend 76 of the selector passage. An upper end of the straight exit ramp 78 of the selector passage 34 is connected with the upper end portion 70 of the selector passage. The exit ramp 78 of the selector passage 34 has a central axis which is disposed in the same flat plane as the central axis of the single bend 76, entrance ramp 74 and lower portion 58 of the selector passage. The exit ramp 78 of the selector passage 34 has a circular cross sectional configuration of the same diameter as the circular cross section of the arcuate bend 76.

The linear upper portion 70 of the selector passage 34 has a lower end which opens into the exit ramp 78 of the selector passage 34. A circular opening at an upper end of the upper portion 70 of the selector passage 34 opens into the article mold cavity 18. The vertical central axis 50 of the upper portion 70 of the selector passage 34 is disposed in the same flat plane as the central axis of the exit ramp 78, single arcuate bend 76, entrance ramp 74, and lower portion 58 of the selector passage 34. Since the vertical central axis 50 of the upper portion 70 of the selector passage 34 is coincident with the vertical axis 44 of the lower portion 58 of the selector passage, the axis 50 of the upper portion 70 of the selector passage extends parallel to and is offset to one side of the central axis 66 of the support element 54.

Although a majority of the surface area of the vertical upper portion 70 of the selector passage 34 is formed by ceramic mold material, a vertical segment of the side surface of the support element 54 is exposed to the interior of the upper portion of the selector passage. Therefore, the surface of the support element 54 forms a vertically extending part of the side wall of the upper portion of the selector passage. The vertical central axis 76 of the support element 54 extends parallel to and is offset to one side of the central axis 50 of the upper portion 70 of the selector passage 34. The support element 54 has a circular cross section with the same diameter as the circular cross section of the upper portion 70 of the selector passage 58. However, the diameter of the support element 54 could be different than the diameter of the selector passage.

Although the support element 54 is exposed to the interiors of the upper and lower portions 70 and 58 of the selector passage 38, the portion of the support element 54 disposed between opposite ends of the single bend portion 62 of the selector passage 34 is completely enclosed by the ceramic mold material. This enables the support element 54 to strengthen the single bend section 42 of the selector 28 against the influence of vertical and/or sideward loads.

The simplicity of construction of the selector passage 34 is promoted by the fact that the single arcuate bend 76 of the selector passage 34 has a central axis which is disposed in the same flat plane as the central axes 44 and 50 of the lower portion 58 and upper portion 70 of the selector passage. In addition, the selector passage 34 has the same circular cross sectional configuration throughout its length. This simplifies tooling for the formation of a mold into which wax pattern material is injected during the forming of the single crystal selector 28.

The selector passage 34 has a substantially uniform circular cross sectional configuration throughout its length with a diameter of less than 0.25 inches. The single arcuate bend 76 is offset from the central axes 44 and 50 of the lower and upper vertical portions 58 and 70 of the selector passage by a distance which is at least 1.5 times the diameter of the single arcuate bend 76 of the selector passage. Thus, the maximum horizontal distance from the center line of the single arcuate bend 76 to the line of the coincident vertical axes 44 and 50 is at least 1.5 times the diameter of the arcuate bend 76 of the selector passage.

In the crystal selector 28 illustrated in FIG. 2, a support element 54 extends downwardly from the crystal selector 28 to the bottom of the starter 30 to enable the support rod 54 to engage the chill plate 12. The opposite end of the support rod 54 extends into the article mold cavity 18. This enables the support rod to transmit force from the article mold 16 directly to the chill plate 12 without applying a load to the single crystal selector 28. However, if desired, the support element 54 could have a lower end portion which is disposed above the starter 30 and an upper end portion which is disposed below the article mold cavity 18.

It is contemplated that certain embodiments of the crystal selector 28 may not require the support rod 54. These embodiments of the crystal selector will be constructed so that both the wax pattern of the selector and the selector itself can withstand normal vertical and/or sideward loads.

CASTING ARTICLE

When the ceramic mold structure 10 is to be used to cast single crystal articles, such as turbine blades, the chill plate 12 (FIG. 1) is lowered and the mold structure is positioned on the chill plate. The chill plate 12 is then raised to position the mold structure in a cylindrical furnace chamber (not shown). A housing enclosing the furnace chamber is then evacuated to provide a nonoxidizing atmosphere.

After the furnace chamber has been evacuated, the mold structure 10 is preheated to a temperature above the liquidius temperature of the metal to be cast. Although the preheat temperature will vary depending upon the composition of the metal alloy to be cast, it is contemplated that the preheat temperature may be approximately 1,500° C. A flow of molten metal is then conducted into the pour cup 22. The metal flows downwardly through the article mold cavities 18 into the crystal selector 28. The molten metal may be a nickel chrome super alloy.

After the mold structure 10 has been filled with molten metal, the chill plate 12 is slowly lowered and the mold is withdrawn from the furnace chamber. Molten metal in each of the starter cavities 34 solidifies as a plurality of elongated and vertically upwardly extending grains. As the mold structure 10 is gradually withdrawn from the furnace chamber, a plurality of grains grow from the starter cavity 32 (FIG. 2) upwardly into the lower portion 58 of the selector passage 34. As the molten metal solidifies in the lower portion 58 of the selector passage 34, the grains which are most favorably oriented for vertical growth tend to crowd out the grains which are less favorably oriented.

Continued solidification of the molten metal in the selector passage 34 results in the grains growing into the upwardly and outwardly inclined entrance ramp 74 of the crystal selector passage 34. As the molten metal solidifies along the entrance ramp 74, the grain or grains which are most favorably oriented for sideward growth, that is toward the left (as viewed in FIG. 2), crowd out the less favorably oriented grains. As the molten metal solidifies in the arcuate bend 76 of the selector passage, the most favorably oriented grain will probably crowd out or will have crowded out any other grain or grains.

As the solidification of the molten metal continues from the arcuate bend 76 of the selector passage 34 and to the upwardly and rightwardly (as viewed in FIG. 2) sloping exit ramp 78 of the selector passage, the single most favorably oriented grain will probably solidify as a single crystal in the exit ramp of the selector passage. However, if there should be an additional grain, it will be crowded out by the most favorably oriented grain as the molten metal in the exit ramp 78 of the selector passage solidifies.

Finally, the molten metal in the vertical upper portion 70 of the selector passage will solidify. The vertical portion 70 of the selector passage is provided in order to be certain that the most favorably oriented grain has crowded out all other grains. Thus, it is contemplated that the molten metal in the upper portion 70 of the selector passage 34 will solidify as a single crystal. However, if a second grain should grow into the upper portion 70 of the selector passage 34, an additional opportunity is provided for the most favorably oriented grain to crowd out the second or less favorably oriented grain. Therefore, a single crystal will grow from the upper portion 70 of the selector passage 34 into the article mold cavity 18. This single crystal expands in the article mold cavity 18 and solidifies with a configuration which corresponds to the configuration of the article to be cast.

The single crystal of metal grows upwardly in the article mold cavity 18 to the gating system 24. In the gating system 24, there may be spurious nucleation with a few additional crystals so that the single crystal structure of the solidifying molten metal may end at a location past the upper end of the article mold cavity 18, that is in the gating system 24.

Although it is preferred to withdraw the mold structure 10 from the furnace to cause a generally horizontal solidification zone to move upwardly from the lower end portion of the mold structure to the upper end portion of the mold structure, the mold structure could be maintained stationary in the furnace chamber. If this were done, a plurality of separate coils could be used in the manner disclosed in U.S. Pat. Nos. 3,346,039; 3,376,915; and 3,405,220. The electrical energy to the lower coils would be gradually reduced and terminated to cause the horizontal solidification zone to move slowly upwardly through the stationary article mold cavity 18.

In one specific embodiment of the single crystal selector 28, the distance from the lower end of the article mold cavity 18 to the lower end of the starter 30 was 2.15 inches. The starter cavity 32 has a height of 0.5 inches and a diameter of 0.75 inches. The lower portion 58 of the selector passage 34 had a height of 0.65 inches. The entrance and exit ramps 74 and 78 each had a length of 0.4 inches. The single arcuate bend 76 in the selector passage had a center line radius of approximately 0.15 inches.

In this specific embodiment of the crystal selector 28, the distance between opposite ends of the entrance and exit ramps 74 and 78 of the selector passage 34 was 0.65 inches. The upper section 48 of the selector passage had a vertical height of 0.25 inches. The selector passage 34 had a circular cross section with a diameter of 0.10 inches. The horizontal distance from the central axes 44 and 50 of the upper and lower portions 58 and 70 of the selector passage to the furthermost point on the center line of the single arcuate bend 76 was 0.5 inches.

The foregoing specific dimensions for the selector passage 34 were obtained by measuring a wax pattern for a specific selector. It should be understood that the foregoing dimensions have been set forth merely for purposes of illustration and not for purposes of limiting the invention. It is contemplated that the dimensions of single crystal selectors constructed in accordance with the present invention will have dimensions which are different than these specific dimensions.

The crystal selector for which the dimensions have been set forth above had a support rod or element 54 with a diameter of 0.1 inches. The support element had an overall length of 2.4 inches.

It should be understood that the foregoing dimensions of the support element, like the other dimensions of the selector, have been set forth for purposes of clarity of illustration and it is not intended that the invention be limited to any particular dimensions. In fact, it is contemplated that the support element 54 could be omitted if desired. Thus, if the selector and its wax pattern are capable of withstanding the vertical and/or sideward loading to which they are subjected, the support element could be eliminated. However, it is preferred to use the support element in order to stabilize the selector and the wax pattern for the selector and to minimize breakage and/or deformation of the selector and/or wax pattern of the selector during handling, the forming of the mold structure 10, and the casting of an article.

SINGLE CRYSTAL SELECTOR-SECOND EMBODIMENT

In the embodiment of the invention illustrated in FIGS. 1-3, the single crystal selector 28 has a selector passage 34 with linear entrance and exit ramps 74 and 78 leading to and from a single arcuate bend 62. In the embodiment of the invention illustrated in FIG. 4, the selector passage has a single continuously curving arcuate bend which interconnects lower and upper portions of the selector passage. Since the embodiment of the invention illustrated in FIG. 4 is generally similar to the embodiment of the invention illustrated in FIGS. 1-3, similar numerals will be utilized to designate similar components, the suffix letter "a" being added to the numerals of FIG. 4 to avoid confusion.

The single crystal selector 28a (FIG. 4) has a lower section 40a which extends upwardly from a starter 30a. A single bend section 42a extends sidewardly and upwardly first away from the vertical lower section 40a and then back toward the longitudinal central axis 44a of the lower section 40a. A vertical upper section 48a extends upwardly from the single bend section 42a and is connected to the article mold 16a. The upper section 48a is vertically aligned with the lower section 40a.

A straight cylindrical support element 54a extends upwardly from the lower section 40a to the upper section 48a. The support element 54a spans the space between opposite ends of the single bend section 42a of the selector 28a. The support element 54a is a cylindrical fused quartz rod and has an outer side surface which has been roughened to facilitate the adherence of ceramic mold material to the surface of the support element. The rod also has beads on both ends for added adherence.

A selector passage 34a is disposed within the single crystal selector 28a and interconnects the starter cavity 32a and article mold cavity 18a. The crystal selector passage 34a includes a linear vertical, lower portion 58a. The cylindrical lower portion 58a of the selector passage 34a has a lower end which opens into the top of the starter cavity 32a and an upper end which opens into a continuously curving bend 76a of the selector passage 34a. A relatively small percentage of the surface area of the lower portion 58a of the selector passage 34a is formed by the outer side surface of the support element 54a. The vertical axis 44a of the lower portion 58a of the selector passage 34a is parallel to and offset to one side of the vertical central axis 66a of the support element 54a.

The single bend 76a of the selector passage 34a continuously curves from a lower end portion which is connected with the lower portion 58a of the selector passage 34a to an upper end portion which is connected with the upper portion 70a of the selector passage. The continuously curving configuration of the single bend portions 76a results in the single bend portion having a generally "C" shaped configuration. Thus, the arcuate bend portion 76a of the selector passage 34a has a generally semicircular configuration.

The cylindrical upper portion 70a has a lower end which opens to the upper end of the continuous arcuate bend 76a and an upper end which opens to the article mold cavity 18a. A relatively small vertical segment of the surface area of the upper portion 70a of the selector passage 34a is formed by the outer side surfaces of the support element 54a. The vertical axis 50a of the upper portion 70a is coincident with the vertical axis 44a of the lower portion 58a of the passage 34a.

The central axis of the continuously curving single bend 76a of the crystal selector passage 34a is disposed in the same plane as the coincident vertical axes 44a and 50a of the lower and upper portions 58a and 70a of the selector passage. The vertical axis 66a of the support element 54a is disposed in the same plane as the central axes of the lower portion 58a, continuous bend 76a and upper portion 70a of the selector passage 34a.

The selector passage 34a has a circular configuration throughout its length with a diameter of less than 0.25 inches. The distance, measured on a horizontal plane, from the coincident vertical axes 44a and 50a of the lower and upper portions 58a and 70a of the selector passage 34a to the furthermost point on the central axis of the continuously curving bent 76a of the selector passage, that is as measured on the horizontal plane extending through the center of curvature of the continuously curving bend 76a, is at least 1.5 times the cross sectional diameter of the selector passage 34a.

During casting of molten metal in the mold structure of which the selector 28a is a part, the molten metal solidifies in the same manner as previously described in connection with the embodiment of the invention shown in FIGS. 1-3. Thus, a plurality of elongated upwardly extending crystals initially solidify in the cylindrical starter cavity 32a. A few of these crystals grow upwardly into the lower portion 58a of the selector passage 34a. As the crystals grow upwardly in the lower portion 58a of the selector passage 34a, the most favorably oriented crystals tend to crowd the less favorably oriented crystals. The molten metal then solidifies upwardly along the continuously curving bend 76a of the selector passage 34a. As this occurs, the crystal which is most favorably oriented for upward and sideward growth crowds the other crystals. Therefore, only one crystal emerges from the upper portion 70a of the selector passage 34a and grows into the article mold cavity 18a.

The dimensions of the single crystal selector 28a may be generally the same as the dimensions of the single crystal selector 28 of FIG. 3. In this specific embodiment, the single crystal selector 28a would have an overall height of 2.15 inches. The selector passage 34a would have a cross sectional diameter of 0.10 inches. The distance from the line of coincident vertical axes 44a and 50a of the lower and upper portions 58a and 70a of the selector passage 34a to the outermost point on the central axis of the continuously curving single bend portion 76a of the selector passage would be 0.5 inches. Of course, the dimensions of different embodiments of the crystal selector 28a could be different than the foregoing dimensions. For example, one specific embodiment of the selector 28a has an overall height of 2.7 inches.

MOLD STRUCTURE FOR DOUBLY ORIENTED SINGLE CRYSTAL ARTICLE

When the single crystal selectors 28 and 28a illustrated in FIGS. 2-4 are used, there is some tendency for the cast single crystal articles to have a secondary orientation axis, corresponding to the [100] growth direction, close to a vertical plane which is parallel to a vertical plane which contains the longitudinal central axis of the selector passage 34. This is because a crystal having this orientation will be most favorably oriented for growth along portions of the selector passage 34 which extend transversely to a vertical central axis of the starter cavity 32. However, due to the nucleation of a relatively large number of single crystals which are randomly oriented in the starter cavity 32, most of the articles cast in the article mold cavities 18 and 18a will have crystallographic orientations in which a secondary orientation axis is not disposed in or close to a plane which contains the longitudinal central axis 44 of the selector passage 34.

In the embodiment of the invention illustrated in FIGS. 5-8, a mold is provided with an improved crystal selector. The improved crystal selector may be used to cast an article as a single crystal with selected primary and secondary orientations, that is, a doubly oriented single crystal article. Since the components of the embodiment of the invention illustrated in FIGS. 5-8 are generally similar to components of the embodiment illustrated in FIGS. 2 and 3, similar numerals will be utilized to designate similar components, the suffix letter "b" being associated with the numerals of FIGS. 5 and 6 to avoid confusion.

An article mold 16b (FIG. 5) is used in a mold structure having the same general construction as the mold structure of FIG. 1. The article mold 16b includes an article mold cavity 18b which is connected in fluid communication with a single crystal selector 28b and a starter 30b. The article mold 16b is formed of ceramic mold material in the manner previously explained in conjunction with the embodiment of the invention illustrated in FIGS. 1-3.

The article mold 16b (FIG. 5) is used to cast a metal article as a single crystal having selected primary and secondary orientations. The selected primary orientation axis of the single crystal article has been designated as the Z axis in FIG. 6 and corresponds to the [001] direction of crystal growth. The Z axis is a vertical axis.

The selected secondary orientation axis of the single crystal article has been designated as the X axis in FIG. 6 and corresponds to the [100] direction of crystal growth. The X axis is perpendicular to the primary or Z axis. The selected secondary or X axis is also perpendicular to a second secondary or Y axis which corresponds to the [010] direction of crystal growth. The X and Y axes are disposed in a horizontal plane.

The selected primary orientation or Z axis and the selected secondary orientation or X axis are disposed in a vertical plane 100 (FIG. 6). The primary and secondary crystallographic orientations of the article cast in the mold cavity 18b (FIG. 5) are disposed relative to features of the single crystal article in such a manner as to enhance the operating characteristics of the article. Of course, if desired, the Y axis could be the selected secondary axis.

The starter 30b includes a cylindrical starter cavity 32b in which a relatively large number of grains or crystals are nucleated with a random secondary orientation. Thus, the molten metal in the starter cavity 32b is solidified against a chill plate and/or against a layer of metal foil disposed over the chill plate. The chill plate and metal foil have an equiaxed crystallographic structure with a large number of randomly oriented grains.

When molten metal in the starter cavity 32b solidifies, it will solidify as a large number of crystals with random secondary orientations. Although the metal solidifies in the starter cavity 32b as crystals with random secondary orientations, the crystals with generally vertical primary orientations tend to quickly dominate. This is due to the relatively large heat gradient established between the cool chill plate and a portion of the article mold 16b immediately above the chill plate. Therefore, grains or crystals which are nucleated in the starter cavity 32b with vertical primary orientations or Z axes tend to crowd out other grains. Although the secondary or X and Y axes of these crystals are horizontal, they are randomly oriented.

In accordance with a feature of this embodiment of the invention, the single crystal selector 28b (FIG. 5) is constructed so that the single crystal of metal which emerges from the selector into the article mold cavity 18b will have: (1) a primary orientation or Z axis which is parallel to a selected primary orientation or Z axis and (2) a secondary orientation or X axis which is within plus or minus 30 degrees of a selected secondary orientation or X axis. In order to obtain the desired secondary orientation of the crystal which grows into the article mold cavity 18b, a crystal selector passage 34b has a portion 74b which slopes downwardly in the direction of solidification of metal along the selector passage 34b. The downwardly sloping portion 74b of the selector passage 34b is hot enough to prevent nucleation of new grains and is cool enough for rapid grain or crystal growth along the downwardly sloping portion of the selector passage.

Due to the relatively rapid grain growth along the downwardly sloping portion 74b of the selector passage 34b, a grain or crystal which is most favorably oriented for growth along the downwardly sloping portion of the selector passage 34b will quickly crowd out less favorably oriented grains. This most favorably grain or crystal will have a vertical primary orientation axis and a secondary orientation axis which is either parallel to or close to parallel to a vertical plane containing a longitudinal central axis 44b of the downwardly sloping portion of the selector passage 34b. By locating the crystal selector 28b with the longitudinal central axis 44b of the downwardly sloping portion 74b of the crystal passage 34b in a plane which is parallel to a vertical plane containing the selected secondary orientation or X axis of the cast article, the grain most favored for growth along the downwardly sloping entrance portion 74b of the selector passage 34b will have a secondary orientation which is the same as or close to the selected secondary orientation or X axis of the cast article.

The single crystal selector 28b (FIG. 5) makes certain that the single crystal of metal which grows from the starter cavity 32b through the crystal selector to the article mold cavity 18b has the desired primary and secondary crystallographic orientations which correspond to the selected crystallographic orientation of the article to be cast in the mold 18b. The crystal selector 28b has a selector passage 34b with a longitudinal central axis 44b which extends transversely to a vertical central axis of the starter cavity 32b for a major portion of the length of the crystal selector 28b. The longitudinal axis 44b of the crystal selector passage 34b is disposed in a single plane parallel to a plane containing the selected primary and secondary orientation axes of the single crystal article.

The longitudinal axis 44b of the crystal selector passage 34b is disposed in a flat vertical plane. The flat vertical plane in which the longitudinal central axis 44b of the crystal selector passage 34b is disposed extends parallel to the plane 100 (FIGS. 6 and 7) in which the primary and secondary orientation axes of the article to be cast are disposed.

The single crystal selector 28b has a one-piece ceramic wall, generally designated with the numeral 38b in FIG. 5, which is integrally formed with the starter 30b and article mold 16b. The wall 38b is formed in the manner previously explained by covering a disposable crystal selector pattern with ceramic mold material.

The crystal selector 28b (FIG. 5) includes a lower section 40b which extends upwardly from the starter 30b. The crystal selector 28b has a single bend section 42b which extends sidewardly and upwardly, first away from and then back toward a vertical central axis of the lower section 40b. An upper section 48b extends upwardly from the single bend section 42b. The upper section 48b is vertically aligned with the lower section 40b and is connected with the article mold 16b. The upper section 48b has a vertical axis which is coincident with the vertical axis of the lower section 40b.

A support element 54b (FIG. 5) extends straight upwardly from the lower section 40b to the upper section 48b. The vertical support element 54b spans the space between opposite ends of the single bend section 42b to support the single bend section against the influence of vertical and/or sideward loading. The support element 54b is a cylindrical quartz rod. The cylindrical surface of the linear fused quartz rod 54b has been roughened to promote adherence of the ceramic mold material to the quartz rod. In addition, beads or bulges are formed at opposite ends of the support element 54b to promote the adherence of wax pattern material to the support element during forming of the mold structure. If desired, the support element 54b could be made of a material other than fused quartz, for example, a suitable ceramic material.

The crystal selector passage 34b (FIG. 5) includes a linear, generally cylindrical, lower portion 58b. A lower end of the vertical portion 58b of the selector passage 34b opens into the top of the starter cavity 32b at a location on the vertical central axis of the cylindrical starter cavity. The opposite or upper end of the straight, vertical lower portion 58b of the selector passage 34b opens into the entrance ramp portion 74b which slopes downwardly in the direction of crystal growth along the selector passage 34b.

The support element 54b has a vertical central axis 66b which extends parallel to and is offset to one side of the central axis of the lower portion 58b of the selector passage 34b. The support element 54b has a circular cross section with the same diameter as a circular cross section of the lower portion 58b of the selector passage 34b.

A single bend portion 62b of the selector passage 34b has a lower end which opens into the top of the lower portion 58b of the selector passage and an upper end which opens into an upper portion 70b of the selector passage 34b. The single bend portion 62b of the selector passage 34b includes the downwardly and outwardly inclined entrance ramp portion 74b which extends from the lower portion 58b of the selector passage to a single arcuate bend 76b. The entrance ramp 74b is straight and has a longitudinal central axis disposed in a plane containing the vertical central axis of the lower portion 58b of the selector passage and the vertical central axis 66b of the support rod 54b. The entrance ramp 74b slopes downwardly at an angle of at least 10 degrees to a horizontal plane.

The single arcuate bend 76b of the selector passage 34b is formed as a portion of a circle and connects the lower end of downwardly sloping, entrance ramp 74b with a lower end of a linear and upwardly sloping exit ramp portion 78b. The arcuately curving central axis 44b of the single bend 76b of the selector passage 34b is disposed in the same flat vertical plane as the central axis of the entrance ramp 74b, the central axis of the lower section 40b, and the vertical central axis of the article mold cavity 18b. The selector passage 34b has a circular cross sectional configuration (FIG. 7) of the same diameter throughout its length. However, if desired, the diameter of the selector passage 34b can vary along its length.

The upwardly and inwardly inclined exit ramp 78b (FIG. 5) of the selector passage 34b has a lower end which is connected with the single arcuate bend 76b of the selector passage. An upper end of the straight exit ramp 78b of the selector passage 34b is connected with the upper end portion 70b of the selector passage. The exit ramp 78b of the selector passage 34b has a central axis which is disposed in the same flat plane as the central axes of the single bend 76b, entrance ramp 74b and lower portion 58b of the selector passage. In the illustrated embodiment of the invention, the exit ramp 78b is longer than the downwardly sloping portion 74b of the selector passage 34b. However, the exit ramp 78b could have the same length or be shorter than the downwardly sloping portion 74b of the selector passage 34b.

The linear upper portion 70b of the selector passage 34b has a lower end which opens into the exit ramp 78b of the selector passage 34b. A circular opening at an upper end of the upper portion 70b of the selector passage 34b opens into the article mold cavity 18b. The vertical central axis of the upper portion 70b of the selector passage 34b is disposed in the same flat vertical plane as the central axis 44b of the exit ramp 78b, single arcuate bend 76b, entrance ramp 74b, and lower portion 58b of the selector passage 34b. The central axis of the upper portion 70b of the selector passage also extends parallel to and is offset to one side of the vertical central axis 66b of the support element 54b.

The vertical central axis 66b of the support element 54b extends parallel to and is offset to one side of the central axis of the upper portion 70b of the selector passage 34b. The support element 54b has a circular cross section of the same diameter as the circular cross section of the upper portion 70b of the selector passage 58b. However, the diameter of the support element 54b could be different than the diameter of the selector passage.

The simplicity of construction of the selector passage 34b is promoted by the fact that the entrance ramp 74b, single arcuate bend 76b, and exit ramp 78b of the selector passage 34b have a central axis 44b which is disposed in the same flat plane as the central axes of the lower portion 58b and upper portion 70b of the selector passage. In addition, the selector passage 34b has the same circular cross sectional configuration throughout its length. This simplifies tooling for the formation of a mold into which wax pattern material is injected during the forming of the single crystal selector 28b.

The selector passage 34b has a substantially uniform circular cross sectional configuration throughout its length with a diameter of less than 0.25 inches. One specific selector passage 34b had a cross sectional diameter of about 0.125 inches. The entrance ramp 74b slopes downwardly at an angle of approximately 70° to a vertical axis and has a length of approximately 0.5 inches. The entrance ramp 74b slopes downwardly for a vertical distance which is greater than the cross sectional diameter of the selector passage 34.

The entrance ramp 74b has a length of approximately 0.4375 inches. The exit ramp 78b has a length of approximately 0.625 inches. The central axis of the arcuate bend 76b has a radius of curvature of about 0.21875 inches or one half of the length of the entrance ramp 74b. The maximum horizontal distance from the longitudinal center line 44b of the single arcuate bend 76b to the vertical center line of the upper or lower portion 48b or 40b is approximately 0.75 inches. The vertical distance between a point on the longitudinal central axis 44b of the entrance ramp 74b at an upper end of the entrance ramp and a point on a longitudinal central axis of the entrance ramp at a lower end of the entrance ramp is less than 2.5 times the thickness or diameter of the entrance ramp.

The foregoing specific dimensions of the selector passage 34b have been set forth herein merely for purposes of clarity of description. The dimensions are approximate since they were obtained by measuring a wax pattern for one specific selector. It is contemplated that selectors constructed in accordance with the present invention will have different dimensions. The relative sizes of the various components may differ from the specific sizes set forth above and illustrated in the drawings.

In the illustrated embodiment of the invention, a support element 54b extends downwardly from the crystal selector 28b to the bottom of the starter 30b to enable the support rod 54b to engage the chill plate. The opposite end of the support rod 54b extends into the article mold cavity 18b. This enables the support rod to transmit force from the article mold directly to the chill plate 12b without applying a load to the single crystal selector 28b. However, if desired, the support element 54b could have a lower end portion which is disposed above the starter 30b and an upper end portion which is disposed below the article mold cavity 18b.

It is contemplated that certain embodiments of the crystal selector 28b may not require the support rod 54b. These embodiments of the crystal selector will be constructed so that both the wax pattern of the selector and the selector itself can withstand normal vertical and/or sideward loads.

The linear, downwardly sloping, entrance ramp portion 74b of the crystal selector 28b is exposed to the chill plate and to the environment around the furnace chamber as the mold structure is withdrawn from the furnace chamber. Therefore, the lower end of the entrance ramp portion 74b of the selector passage 34b is substantially cooler than the upper end of the entrance ramp portion of the selector passage.

Since the lower end of the entrance ramp portion 74b of the selector passage 34b is relatively cool, there is a relatively high rate of crystal growth from the upper end of the entrance ramp to the lower end of the entrance ramp during solidification of molten metal in the selector passage 34b. The relatively high rate of crystal growth along the entrance ramp 74b enables the crystal or grain having a secondary orientation or X axis parallel to a vertical plane containing the longitudinal central axis of the entrance ramp 74b to grow faster along the ramp than a crystal having a secondary orientation or X axis which extends transversely to the vertical plane containing the longitudinal axis of the downwardly sloping entrance ramp portion 74b of the selector passage 34b. Therefore, a crystal having a secondary orientation or X axis extending parallel to the vertical plane containing the longitudinal axis 44b of the entrance ramp portion 74b of the selector passage 34b will crowd out or block the growth of less favorably oriented crystals along the entrance ramp portion 74b.

The crystal which is most favored for growth along the downwardly sloping portion 74b of the selector passage 34b will be the crystal which has a primary orientation or Z axis and a secondary orientation or X axis disposed in a vertical plane which is closest to being parallel to a vertical plane containing the longitudinal central axis of the downwardly sloping portion 74b of the crystal selector passage 34b. Thus, if a crystal entering the downwardly sloping entrance ramp portion 74b of the crystal selector passage 34b has a primary orientation or Z axis and a secondary orientation or X axis disposed in a vertical plane which is parallel to the vertical plane containing the longitudinal central axis of the downwardly sloping entrance ramp portion of the selector passage, this crystal will grow faster and crowd out any other crystals. If the secondary orientations or X axes of all of the crystals entering the downwardly sloping entrance ramp portion 74b of the selector passage 34b are skewed at an angle relative to the vertical plane containing the central axis of the downwardly sloping entrance ramp portion of the selector passage, the crystal having the secondary orientation or X axis which is skewed the least relative to the vertical plane containing the longitudinal central axis of the downwardly sloping entrance ramp portion 74b of the selector passage 34b will be most favorably oriented for growth along the downwardly sloping entrance ramp portion of the selector passage and will crowd out the other crystals.

Ideally, the crystal which grows the fastest along the downwardly sloping entrance ramp portion 74b of the selector passage 34b will have a vertical primary orientation or Z axis and a horizontal secondary orientation or X axis disposed in a vertical plane which is parallel to the vertical plane 100 (FIG. 6). The vertical selected primary orientation or Z axis and the horizontal selected secondary orientation or X axis of the article to be cast in the mold cavity 18b are both disposed in the plane 100 (FIG. 6). However, if none of the crystals entering the downwardly sloping entrance ramp portion 74b of the selector passage 34b have a secondary orientation or X axis which extends parallel to the vertical plane 100 containing the selected primary and secondary orientation axes Z and X of the article to be cast, the grain which grows from the selector passage 34b into the article mold cavity 18b will be the grain having a secondary orientation axis which is the closest to being parallel to the plane 100.

Due to the relatively large temperature gradient in the starter cavity 32b and along the vertical lower portion 58b of the selector passage 34b, all of the grains which enter the downwardly sloping entrance ramp portion 74b of the selector passage 34b will probably have vertical primary orientations or Z axes. However, the crystals entering the downwardly sloping portion 74b of the selector passage 34b will have randomly oriented secondary or X axes. The downwardly sloping entrance ramp portion 74b of the selector passage 34b makes certain that the crystal having a secondary orientation or X axis which most closely parallels the vertical plane containing the longitudinal central axis of downwardly sloping portion 74b will crowd out the other crystals or grains during crystal growth along the downwardly sloping portion toward the bend 76b.

The crystal selector 28b is positioned relative to an article mold with the longitudinal central axis 44b of the selector passage 34b in a vertical plane which extends parallel to the vertical plane 100 (FIG. 6) containing the selected primary and secondary orientations or Z and X axes. Therefore, a crystal which is most favored for growth along the downwardly sloping entrance ramp portion 74b of the selector passage 34b will be a crystal having a secondary orientation or X axis which is most closely parallel to the selected secondary orientation or X axis of the article to be cast in the mold cavity 18b. Although it is preferred to have the downwardly sloping portion 74b of the selector passage 34b ahead of the single bend portion 76b, the downwardly sloping portion 74b of the crystal selector passage could be located after the single bend portion if desired.

In one specific embodiment of the invention, the article mold 16b was located in a circular array (FIG. 8) of identical article molds 16b. The longitudinal axes 44b (FIG. 5) of the selector passages 34b of the article molds 16b of FIG. 8 all extend transversely to radial planes 106 which extend through the article mold cavities 18b and the starter cavities 32b (FIG. 5). This results in the single bend portion 62b of each selector passage 34b being disposed to one side of a vertical radial plane 106 containing the vertical central axes of the article mold cavity 18b and starter cavity 32b.

In the embodiment of the invention illustrated in FIG. 8, the central axes 44b of the selectors 28b extend perpendicular to the radial planes 106. Thus, the longitudinal central axis 44b of each selector passage 34b is disposed in a vertical plane which extends perpendicular to a vertical radial plane 106 and which contains the vertical central axes of the article mold cavity 18b and starter cavity 32b. However, it should be understood that selectors 28b could be oriented with the longitudinal central axes 44b of the selector passages 34b disposed in vertical planes which are skewed at an acute angle to the radial planes 106. The precise orientation of the selectors 28b relative to the radial planes 106 will depend upon the configurations and orientations of the article molds 16b, the configurations and dimensions of the selectors 28b, and the temperature gradient characteristics associated with a particular casting operation.

Generally speaking, the central portion of the circular array of article molds 16b (FIG. 8) will be cooler than the peripheral portion of the circular array of article molds. This is because the article molds 16b are heated by radiation from a cylindrical furnace side wall which extends around and is spaced from the outside of the circular array of article molds. By positioning the crystal selectors 28b so that they project outwardly toward the side wall of the furnace, the crystal selectors will tend to be hotter. By positioning the crystal selectors 28b so that they project inwardly toward the center of the circular array of article molds 16b, the crystal selectors tend to be cooler. Of course, the positions of the article molds 16b would have to be adjusted to maintain the longitudinal central axes 44b of the selector passages 34b parallel to a plane 100 containing the selected primary and secondary orientation axes of the cast articles.

CASTING DOUBLY ORIENTED SINGLE CRYSTAL ARTICLE

When the ceramic mold structure is to be used to cast doubly oriented single crystal oriented metal, such as turbine blades, the chill plate is lowered and the mold structure is positioned on the chill plate in the manner previously explained. The chill plate is then raised to position the mold structure in a cylindrical furnace chamber. A housing enclosing the furnace chamber is then evacuated to provide a nonoxidizing atmosphere.

After the furnace chamber has been evacuated, the mold structure is preheated to a temperature above the liquidius temperature of the metal to be cast. Although the preheat temperature will vary depending upon the composition of the metal alloy to be cast, it is contemplated that the preheat temperature may be approximately 1,500° C. A flow of molten metal is then conducted downwardly through the article mold cavity 18b, crystal selector 28b and into the starter cavity 32b. The molten metal in the starter cavity 32b engages the upper side surface of the chill plate and/or a layer of metal foil disposed between the mold structure and the chill plate. The upper side surface of the chill plate and/or the layer of metal foil has an equiaxed grain structure with randomly oriented crystals.

After the starter cavity 32b has been filled with molten metal, the chill plate is slowly lowered and the mold is withdrawn from the furnace chamber. As the mold is lowered, a large number of crystals grow upwardly from the lower end portion of the starter cavity 32b toward the upper end portion of the starter cavity. Due to the relatively large vertical heat gradient between the upper and lower end portions of the starter cavity 32b, the crystals most favorably oriented for vertical growth will tend to crowd out the crystals which are less favorably oriented. Therefore, crystals having vertical primary orientations or Z axes will tend to crowd out crystals having primary orientations or Z axes which are not vertical.

Although a vertical primary orientation or Z axis is favored for crystal growth in the starter cavity 32b, there is no one direction of secondary crystal growth which is favored. Therefore, most of the crystals which grow from the starter cavity 32b into the vertical lower portion 58b of the selector passage 34b will probably have vertical primary orientations or Z axes and randomly oriented secondary orientations or X and Y axes. As the crystals grow upwardly along the vertical lower portion 58b of the selector passage 34b, the vertical primary growth direction will be favored.

By the time the crystals enter the downwardly sloping portion 74b of the crystal selector passage 34b, all of the crystals will probably have vertical primary orientations or Z axes. However, the crystals which enter the downwardly sloping portion 74b of the selector passage 34b will have secondary orientations or X and Y axes which are randomly oriented in a horizontal plane. There is a substantial heat gradient between the upper and lower ends of the downwardly sloping entrance ramp portion 74b of the crystal selector passage 34b. This heat gradient causes the crystal having a secondary orientation or X axis which is most closely parallel to the vertical plane containing longitudinal central axis 44b of the downwardly sloping entrance ramp portion 74b of the crystal selector passage 34b to quickly grow along the downwardly sloping entrance ramp portion of the crystal selector passage 34b. As this occurs, the most favored crystal crowds out any other crystals which enter the downwardly sloping portion 74b of the crystal selector passage 34b.

As the solidification of the molten metal continues, one or more of the crystals or grains will grow upwardly into the arcuate bend portion 76b of the selector passage 34b. If more than one crystal grows into the bend portion 76b, as the grains or crystals grow through the bend portion of the selector passage 34b, the crystal having a vertical primary orientation or Z axis and a horizontal secondary orientation or X axis in a plane parallel to the plane 100 (FIG. 6) will be most favored. The most favored crystal will crowd out any other less favored grains or crystals which somehow managed to grow this far.

As the solidification of the molten metal continues from the arcuate bend 76b of the selector passage 34b into the upwardly and rightwardly (as viewed in FIG. 5) sloping exit ramp 78b of the selector passage, the crystal or crystals will grow upwardly and sidewardly. The longitudinal central axis of the exit ramp 78b is disposed in a plane parallel to the plane 100 containing the selected primary and secondary orientations or X and Z axes of the article to be cast. Therefore, the crystal having a crystallographic orientation which corresponds most closely to the selected crystallographic orientation of the article to be cast will be most favored for growth. Therefore, if more than one crystal somehow manages to grow into the exit ramp 78b, the most favorably oriented crystal having a vertical primary orientation and a secondary orientation or X axis which is closest to being parallel to the selected secondary orientation or X axis of the article to be cast will be favored for growth along the exit ramp and will crowd out a less favorably oriented crystal.

Finally, the molten metal in the vertical upper portion 70b of the selector passage will solidify as the crystal continues to grow upwardly. The crystal will grow into the article mold cavity 18b. Since the crystal which grows from the exit ramp 78b to the vertical portion 70b of the selector passage 34b will have a crystallographic orientation which very closely corresponds to selected crystallographic orientation of the article to be cast in the mold cavity 18b, the molten metal in the mold cavity 18b will solidify as a single crystal having primary and secondary orientations which either correspond exactly to or are very close to the selected primary and secondary orientations.

During the casting of twenty-nine articles in molds using crystal selectors having the same construction as the crystal selector 28b of FIG. 5, the resulting cast articles had vertical primary orientations or Z axes. The secondary orientations or X axes of many of the cast articles deviated somewhat from the selected secondary orientation or X axes. The amount of deviation of the secondary orientation or X axes from the selected secondary orientations is illustrated by the graph in FIG. 9.

Three of the cast articles had zero degrees of deviation of the secondary orientation or X axes from the selected orientation. Thus, the primary orientation or Z axes and the secondary orientation or X axes of these three cast articles were disposed in planes extending parallel to the plane 100 (FIG. 6) in which the selected primary and secondary orientations or Z and X axes were disposed. Approximately 93% or twenty-seven of the twenty-nine articles had secondary orientation axes which was within plus or minus 30 degrees of the selected secondary orientation axis. Thus, by using the crystal selector 28b, without using a single crystal seed, substantially all, that is, more than 85% of the cast articles, had a primary orientation or Z axis which corresponded to the selected primary orientation and a secondary orientation or X axis which was within plus or minus 30 degrees of the selected secondary orientation axis.

SEED CRYSTAL

The crystal selector 28b of FIG. 5 can be used to almost always cast single crystal metal articles having a selected primary orientation axis and a secondary orientation axis which is within plus or minus 30 degrees of the selected orientation axis. Thus, more than 85% of the time the crystal selector shown in FIG. 5 will yield a casting having the selected primary orientation and a secondary orientation which is within plus or minus 30 degrees of the selected secondary orientation. However, it may be desired to have even closer correspondence between the secondary orientation of the cast articles and the selected secondary orientation. If this is the case, a single crystal seed may be used in association with the crystal selector of FIG. 5.

The embodiment of the invention illustrated in FIG. 10 uses a single crystal seed in association with the crystal selector of FIG. 5. Since the embodiment of the invention illustrated in FIG. 10 is generally similar to the embodiment of the invention illustrated in FIG. 5, similar numerals will be utilized to designate similar components, the suffix letter "c" being associated with the numerals of FIG. 10 in order to avoid confusion.

An article mold 16c (FIG. 10) is used in a mold structure having the same general construction as the mold structure of FIGS. 1 and 8. The article mold 16c includes an article mold cavity 18c which is connected in fluid communication with a single crystal selector 28c and a starter 30c. The article mold 16c is formed of ceramic mold material in the manner previously explained in conjunction with the embodiment of the invention illustrated in FIGS. 1-3.

The article mold cavity 18c is used to cast a metal article as a single crystal having primary and secondary orientations which are very close to selected primary and secondary orientations. The selected primary orientation axis of the single crystal article has been designated as the Z axis in FIG. 11 and corresponds to the [001] direction of crystal growth. The Z axis is a vertical axis.

The selected secondary orientation axis of the single crystal article has been designated as the X axis in FIG. 11 and corresponds to the [100] direction of crystal growth. The X axis is perpendicular to the primary or Z axis. The selected secondary or X axis is also perpendicular to a second secondary or Y axis which corresponds to the [010] direction of crystal growth. The X and Y axes are disposed in a horizontal plane.

The selected primary orientation or Z axis and the selected secondary orientation or X axis are disposed in a vertical plane 130 (FIG. 11). The primary and secondary crystallographic orientations of the article cast in the mold cavity 18c (FIG. 11) are disposed relative to features of the single crystal article in such a manner as to enhance the operating characteristics of the article. Of course, if desired, the Y axis could be the selected secondary axis.

The starter 30c defines a starter cavity 32c in which solidification of molten metal is initiated as one or more single crystal. A cylindrical single crystal metal seed 134 is disposed in a cylindrical retainer or holder 136. The holder 136 holds the seed 134 with a primary orientation axis parallel to the selected primary orientation axis of the single crystal article and with a secondary orientation axis parallel to the selected secondary orientation axis of the single crystal article. The seed 134 is formed of a metal similar to the metal to be cast in the article mold cavity 18c.

The holder 136 holds the single crystal metal seed 134 with a primary orientation axis, designated Z in FIG. 12 and corresponding to the [001] direction of crystal growth, extending vertically. The secondary orientation or X axis of the 134 seed corresponds to the [100] direction of crystal growth and extends perpendicular to both the Z axis and to a second secondary or Y axis. The Y axis corresponds to the [010] direction of crystal growth. The X and Y axes (FIG. 12) are disposed in a horizontal plane.

The primary and secondary orientation or Z and X axes of the single crystal seed 134 are disposed in a vertical plane 140 (FIG. 12). The plane 140 extends parallel to the vertical plane 130 (FIG. 6) in which the primary and secondary orientation or Z and X axes for the cast article are disposed. Thus, the primary orientation or Z axis of the single crystal seed 134 is parallel to the selected primary orientation or Z axis of the cast article. Similarly, the secondary orientation or X axis of the seed 134 is parallel to the selected secondary orientation or X axis of the single crystal article. In the illustrated embodiment of the article mold 16c, the planes 130 and 140 are coincident. However, the planes could be offset relative to each other if desired.

The selector 28c (FIG. 10) allows only a single crystal of metal to grow from the starter cavity 32c into the article mold cavity 18c. Although it is desired to have only one crystal nucleate at the circular upper side surface 142 of the seed 134, during casting on a production basis, more than one crystal frequently nucleates in the starter cavity 32c. Since only a main crystal which nucleates at the surface 142 of the seed 134 will probably have the desired crystallographic orientation, the other crystals which nucleate in the starter cavity 32c are blocked from growing into the article mold cavity 18c by the selector 28c.

The single crystal selector 28c (FIG. 10) makes certain that the single crystal of metal which grows from the starter cavity 32c through the crystal selector to the article mold cavity 18c has the desired primary and secondary crystallographic orientations which correspond to the crystallographic orientation of the seed 134 and selected crystallographic orientation of the article to be cast in the mold 18c. The crystal selector 28c has a selector passage 34c with a longitudinal central axis 44c which extends transversely to a vertical central axis of the starter cavity 32c for a major portion of the length of the crystal selector 28c. The longitudinal axis 44c of the crystal selector passage 34c is disposed in a single plane parallel to the plane 130 containing both the primary and secondary orientation axes of the single crystal article.

The single crystal selector 28c has a one-piece ceramic wall, generally designated with the numeral 38c in FIG. 10, which is integrally formed with the starter 30c and article mold 16c. The wall 38c is formed in the manner previously explained by covering a disposable crystal selector pattern with ceramic mold material.

The crystal selector 28c (FIG. 5) includes a lower section 40c which extends upwardly from the starter 30c. The crystal selector 28c has a single bend section 42c which extends first away from and then back toward a vertical central axis of the lower section 40c. An upper section 48c extends upwardly from the single bend section 42c. The upper section 48c is vertically aligned with the lower section 40c and is connected with the article mold 16c. The upper section 48c has a vertical axis which is coincident with the vertical axis of the lower section 40c.

A support element 54c extends straight upwardly from the lower section 40c to the upper section 48c. The vertical support element 54c spans the space between opposite ends of the single bend section 42c to support the single bend section against the influence of vertical and/or sideward loading. The support element 54c is a cylindrical quartz rod.

The crystal selector passage 34c includes a vertical, generally cylindrical, lower portion 58c. A lower end of the vertical linear portion 58c of the selector passage 34c opens into the top of the starter cavity 32c at a location on the vertical central axis of the cylindrical starter cavity 32c. The opposite or upper end of the straight lower portion 58c of the selector passage 34c opens into a single bend portion 62c of the selector passage.

The support element 54c has a vertical central axis 66c which extends parallel to and is offset to one side of the central axis of the lower portion 58c of the selector passage 34c. The support element 54c has a circular cross section with the same diameter as a circular cross section of the lower portion 58c of the selector passage 34c.

The single bend portion 62c of the selector passage 34c has a lower end which opens into the top of the lower portion 58c of the selector passage and an upper end which opens into an upper portion 70c of the selector passage 34c. The single bend portion 62c of the selector passage 34c has a downwardly and outwardly inclined entrance ramp 74c which extends from the lower portion 58c of the selector passage to a single arcuate bend 76c. The downwardly sloping entrance ramp 74c is straight and has a longitudinal central axis disposed in a plane containing the vertical central axis of the lower portion 58c of the selector passage and the vertical central axis 66c of the support rod 54c.

The single arcuate bend 76c of the selector passage 34c is formed as a portion of a circle and connects the lower end of the downwardly sloping entrance ramp 74c with a linear exit ramp 78c. The arcuately curving central axis 44c of the single bend 76c of the selector passage 34c is disposed in the same flat plane as the central axis of the entrance ramp 74c, the central axis of the lower section 40c and the central axis 66c of the support rod 54c. The single arcuate bend 76c has a circular cross sectional configuration of the same diameter as the circular cross section of the entrance ramp 74c. However, if desired, the diameter of the selector passage 34c can vary along its entire length.

The upwardly and inwardly inclined exit ramp 78c (FIG. 5) of the selector passage 34c has a lower end which is connected with the single arcuate bend 76c of the selector passage. An upper end of the straight exit ramp 78c of the selector passage 34c is connected with the upper end portion 70c of the selector passage. The exit ramp 78c of the selector passage 34c has a central axis which is disposed in the same flat plane as the central axis of the single bend 76c, entrance ramp 74c and lower portion 58c of the selector passage. The exit ramp 78c of the selector passage 34c has a circular cross sectional configuration of the same diameter as the circular cross section of the arcuate bend 76c.

The linear upper portion 70c of the selector passage 34c has a lower end which opens into the exit ramp 78c of the selector passage 34c. A circular opening at an upper end of the upper portion 70c of the selector passage 34c opens into the article mold cavity 18c. The vertical central axis of the upper portion 70c of the selector passage 34c is disposed in the same flat plane as the central axis of the exit ramp 78c, single arcuate bend 76c, entrance ramp 74c, and lower portion 58c of the selector passage 34c. The vertical central axis of the upper portion 70c of the selector passage 34c is offset to the right (as viewed in FIG. 10) of the vertical axis of the lower portion 58c of the selector passage. The central axis of the upper portion 70c of the selector passage also extends parallel to and is offset to one side of the vertical central axis 66c of the support element 54c. The continuous longitudinal central axis 44c of the selector passage 34c is disposed in a flat vertical plane which is parallel to the planes 130 and 140 of FIGS. 11 and 12.

After the mold structure has been filled with molten metal, the chill plate is slowly lowered and the mold withdrawn from the furnace chamber. Molten metal in the starter cavity 32c solidifies as one or more single crystal grains. A main grain solidifies upwardly from the upper side surface 142 of the single crystal seed 134. This main grain has a vertical primary orientation axis parallel to the selected primary orientation or Z axis (FIG. 11) of the single crystal article to be cast in the article mold cavity 18c. The main grain also has a horizontal secondary orientation axis parallel to the selected secondary orientation or X axis (FIG. 11) of the single crystal article to be cast in the article mold cavity 18c.

In addition to the main grain, one or more secondary single crystal grains may nucleate in the starter cavity 32c. These extra or secondary grains will have a random crystallographic orientation. Therefore, the crystallographic orientation of these secondary grains will probably not correspond to the selected crystallographic orientation of the article to be cast in the mold cavity 18c.

If only one crystal of metal grew in the starter cavity 32c from the seed crystal 134, the crystal selector 28c would not be necessary. However, during production casting operations, it is contemplated that a plurality of crystals will probably grow in the starter cavity 32c on numerous occasions. Therefore, the crystal selector 28c is necessary to be certain that only a crystal having an orientation which corresponds to the selected orientation of the article to be cast in the mold cavity 18c grows into the article mold cavity.

Since the longitudinal central axis 44c of the crystal selector passage 34c is disposed in a plane which extends parallel to the plane 130 (FIG. 11) containing the selected primary and secondary orientation axes Z and X, and since the downwardly sloping portion 74c of the selector passage 34c extends transversely to a vertical axis, only a crystal having a crystallographic orientation corresponding to the selected crystallographic orientation for the article cast in the cavity 18c will be favored for growth in the selector passage 34c. Thus, if the secondary axis of a crystal which nucleates in the starter cavity 32c is parallel to the selected secondary orientation or X axis of the article to be cast in the mold cavity 18c, this crystal will be most favored for growth along the downwardly sloping entrance ramp 74c of the selector passage and along the upwardly inclined exit ramp 78c of the selector passage. Of course, only a crystal having a primary orientation or Z axis which is vertical will be favored for growth along the selector passage 74c.

The crystal selector 28c of FIG. 10 has the same construction as the crystal selector 28b (FIG. 5). However, the crystal selector 28c (FIG. 10) is associated with a single crystal seed 134. By using the seed 134, a relatively close correspondence can be obtained between the secondary orientation or X axis of the cast article and the selected secondary orientation or X axis for the cast article. Thus, with the crystal selector 28b of FIG. 5, which does not use a seed, substantially all, that is 85% or more, of the articles cast with the crystal selector will have a secondary orientation axis which is within plus or minus 30 degrees of the selected secondary orientation axis. It is contemplated that this degree of accuracy will be satisfactory for many products and does not require the complication of using a single crystal seed. However, when it is desired to have the secondary orientation or X axis very close to the selected secondary orientation or X axis for a cast article, the single crystal seed 134 can be used with the crystal selector 28b, in the manner shown in FIG. 10, with the crystal selector 28c to obtain almost precise correspondence between the secondary orientation or X axis of the cast article and the selected secondary orientation or X axis.

CONCLUSION

Molds 16b (FIG. 5) constructed in accordance with the present invention may be utilized to cast single crystal metal articles with substantially all of the articles having selected primary orientation axes and secondary orientation axes which are within plus or minus 30 degrees of selected secondary orientation axes. This is accomplished without using seed crystals.

Due to the heat gradients established in the mold 16b during withdrawal of the mold from a furnace chamber, the casting of a single crystal metal article with a selected primary orientation axis is relatively easily accomplished using the crystal selector 16 of FIG. 2 without a seed crystal. However, the casting of a single crystal metal article with a secondary orientation axis which is within plus or minus 30 degrees of a selected secondary orientation axis previously required the use of a seed crystal.

The casting of single crystal metal articles with secondary orientation axes which are within plus or minus 30 degrees of selected secondary orientation axes is accomplished by having portions 74b of selector passages 34b slope downwardly in the direction of solidification of metal along the selector passages. The downwardly sloping portion 74b of each selector passage 34b is hot enough to prevent the nucleation of new grains and, during withdrawal of the mold from the furnace chamber, it is cool enough to have rapid grain growth along the downwardly sloping portion of the selector passage.

Due to the relatively rapid grain growth along the downwardly sloping portion 74b of the selector passage 34b (FIG. 5), a grain or crystal which is most favorably oriented for growth along the downwardly sloping portion of the selector passage will quickly crowd out less favorably oriented grains. A crystal or grain which is most favorably oriented for growth along the downwardly sloping portion 74b of the selector passage 34b will have a vertical primary orientation axis. This most favored grain will also have a secondary orientation axis which is disposed in a vertical plane parallel to or close to parallel to a vertical plane containing a longitudinal central axis 44b of the downwardly sloping portion 74b of the selector passage 34b.

The downwardly sloping portion 74b of the selector passage 34b is located with its longitudinal central axis 44b in a vertical plane which is parallel to the vertical plane 100 containing a selected or desired secondary orientation axis of a cast article. The grain or crystal most favored for growth along the downwardly sloping portion 74b of the selector passage 34b will have a secondary orientation axis which is in or close to the vertical plane containing the longitudinal axis 44b of the downwardly sloping portion 74b of the selector passage 34b. Therefore, the secondary orientation or X axis of the crystal most favored for growth along the downwardly sloping portion 74b of the selector passage 34b will be parallel to or close to parallel to the selected secondary orientation axis of the cast article.

In one specific embodiment of the invention, a mold structure (FIG. 8) included a plurality of article molds 16b which were disposed in a circular array. Each of the article molds 16b had crystal selectors which extended transversely to vertical radial planes 106 through article mold cavities 18b of the various article molds. The specific crystal selectors 28b included a single bend portion 42b which was disposed at one side of a vertical radial plane through the article mold 18b.

In order to cast single crystal articles having secondary orientation axes which are very close to selected secondary orientation axes, a seed crystal 136 (FIG. 10) may be utilized. Thus, the improved single crystal selector 28b (FIG. 5) can be used to cast single crystal articles with a secondary orientation axis which is within plus or minus 30 degrees of selected secondary orientation axes without resorting to the use of seed crystals. However, when it is desired to cast only single crystal articles having secondary orientation axes which almost exactly correspond to selected secondary orientation axes for the articles, seed crystals 134 are utilized. The seed crystals 134 (FIG. 10) are placed in starter sections 30c of the molds 16c with the primary orientation axes of the seed crystals parallel to the selected primary orientation axes of the cast articles, that is, usually vertical. Secondary orientation axes of the seed crystals 134 are located parallel to the selected secondary orientation axes of the single crystal articles.

Having described specific preferred embodiments of the invention, the following is claimed:

1. A mold for use in casting a single crystal metal article, said mold comprising article mold means for defining an article mold cavity having a configuration corresponding to the configuration of the article to be cast, starter means for defining a starter cavity in which molten metal solidifies, and selector means extending between an upper end portion of said starter means and a lower end portion of said article mold means for at least partially defining a crystal selector passage which extends between said starter cavity and said article mold cavity and from which a single crystal of metal solidifies upwardly into said article mold cavity, said selector means including a lower section connected with said starter means and in which a lower portion of said selector passage extends away from said starter cavity, an upper section connected with said article mold means and in which an upper portion of said selector passage extends downwardly away from said article mold cavity and a connector section connected with said upper and lower sections of said selector means, said connector section of said selector means including an entry section in which a first portion of said selector passage slopes downwardly away from an upper end of said lower portion of said selector passage, a single bend section in which a single bend portion of said selector passage extends upwardly away from a lower end of said first portion of said selector passage, and an exit section in which a second portion of said selector passage slopes upwardly from an upper end of said single bend portion of said selector passage to a lower end of the upper portion of said selector passage.

2. A mold as set forth in claim 1 wherein said first portion, single bend portion and second portion of said selector passage have a longitudinal central axis which is disposed in a vertical plane.

3. A mold as set forth in claim 1 wherein said first portion of said selector passage has a linear configuration and slopes downwardly at an angle of at least 10 degrees to a horizontal plane.

4. A mold as set forth in claim 1 wherein said first portion of said selector passage has a uniform circular cross sectional configuration in a plane extending perpendicular to a longitudinal central axis of said first portion of said selector passage, said first portion of said selector passage sloping downwardly at an angle so that the vertical distance between a point on the longitudinal axis of the first portion of said selector passage at an upper end of said first portion of said selector passage and a point on the longitudinal axis of the first portion of said selector passage at the lower end of said first portion of said selector passage is at least as great as the diameter of the first portion of said selector passage.

5. A mold as set forth in claim 1 wherein said second portion of said selector passage is longer than said first portion of said selector passage.

6. A mold as set forth in claim 1 wherein said single bend portion of said selector passage has a longitudinal central axis which is disposed in a vertical plane.

7. A mold as set forth in claim 1 wherein the single crystal metal article has selected primary and secondary orientations, said selector passage having a longitudinal central axis which is disposed in a plane which is parallel to a plane containing both the selected primary orientation axis of the single crystal article and the selected secondary orientation axis of the single crystal article when the single crystal article is cast in said article mold cavity.

8. A mold as set forth in claim 7 wherein said starter means includes surface means for holding a seed which includes a single crystal, said surface means holding the single crystal seed with a primary orientation axis parallel to the selected primary orientation axis of the single crystal article and a secondary orientation axis parallel to the selected secondary orientation axis of the single crystal article when the single crystal article is cast in said article mold cavity.

9. A mold as set forth in claim 1 wherein a vertical central axis of said article mold cavity is disposed in a plane which contains a longitudinal central axis of said selector passage.

10. A mold as set forth in claim 9 wherein a vertical central axis of said starter cavity is disposed in the same plane as the longitudinal central axis of said selector passage.

11. A mold as set forth in claim 10 wherein the vertical central axis of the article mold cavity is offset to one side of the vertical central axis of the starter cavity.

12. A mold as set forth in claim 10 wherein the vertical central axis of the article mold cavity is coincident with the vertical central axis of said starter cavity.

13. A mold as set forth in claim 1 further including a support element which extends between said entry section and said exit section of said connector section of said selector means.

14. A mold as set forth in claim 1 wherein the horizontal distance between vertical central axes of said upper and lower portions of said selector passage and a furthest point on a longitudinal central axis of said single bend portion of said selector passage is at least as great as 1.5 times the thickness of the selector passage at the single arcuate bend of said selector passage.

15. A mold as set forth in claim 1 wherein the vertical distance between a point on the longitudinal central axis of said first portion of said selector passage at an upper end of said first portion of said selector passage and a point on the longitudinal central axis of said first portion of said selector passage at a lower end of said first portion of said selector passage is less than 2.5 times the thickness of said selector passage at the upper and lower ends of said first portion of said selector passage.

16. A mold as set forth in claim 1 wherein said selector passage has a generally circular cross sectional configuration with a diameter which is less than 0.25 inches throughout the length of said first portion, single bend portion and second portion of said selector passage.

17. A mold as set forth in claim 1 wherein opposite ends of said single bend portion of said selector passage are vertically spaced apart, said mold further including a support element which spans the space between the opposite ends of said single bend portion of said selector passage.

18. A mold as set forth in claim 1 further including a support element having a vertical central axis which is disposed in a plane containing a longitudinal central axis of said single bend portion of said selector passage.

19. A mold as set forth in claim 1 further including a support element disposed adjacent to a side of said upper and lower portions of said selector passage opposite from said single bend portion of said selector passage.

20. A mold as set forth in claim 19 wherein an upper end portion of said support element is engaged by said article mold means and a lower end portion of said support element is engaged by said starter means.

21. A mold as set forth in claim 1 wherein said single bend portion of said selector passage has an arcuate configuration with a longitudinal central axis having a radius of curvature which is greater than the vertical distance between a point on the longitudinal central axis of said first portion of said selector passage at an upper end of said first portion of said selector passage and a point on the longitudinal central axis of said first portion of said selector passage at a lower end of said first portion of said selector passage.

22. A mold for use in casting a single crystal metal article, said mold comprising article mold means for defining an article mold cavity having a configuration corresponding to the configuration of the article to be cast, starter means for defining a starter cavity in which molten metal solidifies, and selector means extending between an upper end portion of said starter means and a lower end portion of said article mold means for at least partially defining a crystal selector passage along which metal solidifies from said starter cavity to said article mold cavity and from which a single crystal of metal solidifies upwardly into said article mold cavity, said selector passage having a portion which slopes downwardly in the direction of solidification of metal along said selector passage.

23. A mold as set forth in claim 22 wherein said selector means includes a lower section connected with said starter means and in which a lower portion of said selector passage extends away from said starter cavity, an upper section connected with said article mold means and in which an upper portion of said selector passage extends downwardly away from said article mold cavity, and a connector section connected with said upper and lower sections of said selector means and having a single bend in which a single bend portion of said selector passage is disposed, said portion of said selector passage which slopes downwardly in the direction of solidification of metal along said selector passage having a lower end portion connected with a lower end portion of the single bend portion of said selector passage.

24. A mold as set forth in claim 22 wherein said portion of said selector passage which slopes downwardly in the direction of solidification of metal along said selector passage has a linear configuration with a longitudinal central axis which extends transversely to a vertical central axis of said starter cavity.

25. A mold as set forth in claim 22 wherein said portion of said selector passage which slopes downwardly in the direction of solidification of metal along said selector passage has a lower end portion which is disposed above an upper end portion of said starter cavity.

26. A mold as set forth in claim 22 wherein said selector means includes a lower section connected with said starter means and in which a lower portion of said selector passage extends away from said starter cavity, said portion of said selector passage which slopes downwardly in the direction of solidification of metal along said selector passage being connected with an upper end portion of said lower portion of said selector passage, said lower portion of said selector passage extending upwardly for a vertical distance which is greater than a vertical distance through which said portion of said selector passage which slopes downwardly in the direction of solidification of metal along said selector passage extends downwardly.

27. A mold as set forth in claim 22 wherein the single crystal metal article has selected primary and secondary orientations, said portion of said selector passage which slopes downwardly in the direction of solidification of metal along said selector passage having a longitudinal central axis which is disposed in a vertical plane extending parallel to a vertical plane containing the selected primary orientation axis of the single crystal article and the selected secondary orientation axis of the single crystal article when the single crystal article is cast in the article mold cavity.

28. A mold as set forth in claim 27 wherein said starter means includes surface means for holding a seed which includes a single crystal, said surface means holding the single crystal seed with a primary orientation axis parallel to the selected primary orientation axis of the single crystal article and a secondary orientation axis parallel to the selected secondary orientation axis of the single crystal article when the single crystal article is cast in the article mold cavity.

29. A mold as set forth in claim 22 wherein the single crystal metal article has selected primary and secondary orientations, said selector passage having a longitudinal central axis which extends from said starter cavity to said article mold cavity, said longitudinal central axis of said selector passage being disposed in a vertical plane which is parallel to a plane containing both the selected primary orientation axis of the single crystal article and the selected secondary orientation axis of the single crystal article.

30. A mold as set forth in claim 22 wherein said selector means includes a lower section connected with said starter means and in which a lower portion of said selector passage extends away from said starter cavity, an upper section connected with said article mold means and in which an upper portion of said selector passage extends downwardly away from said article mold cavity, and a connector section connected with said upper and lower sections of said selector means and having a single bend, said connector section of said selector means including said portion of said selector passage which slopes downwardly in the direction of solidification of metal along said selector passage, a single bend section in which a single bend portion of said selector passage curves upwardly away from a lower end of said portion of said selector passage which slopes downwardly in the direction of solidification of metal along said selector passage, and an exit section in which a second portion of said selector passage slopes downwardly from an upper end of said single bend portion of said selector passage to a lower end of the upper portion of said selector passage.

31. A method of casting a single crystal article, said method comprising the steps of initiating solidification of a plurality of crystals of metal in a starter cavity, growing crystals of metal from the starter cavity along a selector passage, said step of growing crystals of metal along a selector passage including growing one or more crystals of metal along a downwardly sloping portion of the selector passage and, thereafter, growing one or more crystals of metal along an upwardly extending portion of the selector passage, and growing only one crystal of metal from the selector passage into an article mold cavity.

32. A method as set forth in claim 31 wherein said step of initiating solidification of a plurality of crystals of metal in a starter cavity includes initiating solidification of a crystal of metal in the starter cavity from a surface of a single crystal seed with a primary orientation axis of the crystal of metal parallel to a selected primary orientation axis of the single crystal article and a secondary orientation axis parallel to a selected secondary orientation axis of the single crystal article.

33. A method as set forth in claim 31 wherein said step of growing one or more crystals of metal along a selector passage further includes growing one or more crystals of metal along a bend portion of the selector passage having a longitudinal axis disposed in a vertical plane.

34. A method as set forth in claim 33 wherein said step of growing one or more crystals of metal along a bend portion of the selector passage is performed after performing said step of growing one or more crystals of metal along a downwardly sloping portion of the selector passage and during performance of said step of growing one or more crystals along an upwardly extending portion of the selector passage.

35. A method as set forth in claim 31 wherein said step of growing crystals of metal from the starter cavity along a selector passage includes growing a plurality of crystals of metal upwardly from the starter cavity into the selector passage.

36. A method as set forth in claim 31 wherein said step of growing one or more crystals of metal along a downwardly sloping portion of the selector passage includes growing one or more crystals of metal along a downwardly sloping path having a longitudinal central axis disposed in a vertical plane extending parallel to a plane containing a selected primary orientation axis of the single crystal article and a selected secondary orientation axis of the single crystal article.

37. A method as set forth in claim 31 wherein said step of growing only one crystal of metal from the selector passage into the article mold cavity includes growing a crystal of metal having a primary orientation axis extending parallel to a selected primary orientation axis of the single crystal article and a secondary orientation axis which is within plus or minus 30 degrees of being parallel to a selected secondary orientation axis into the article mold cavity.

38. A method as set forth in claim 31 wherein said step of initiating solidification of a plurality of metal crystals in a starter cavity includes engaging a relatively cool surface formed by a plurality of metal crystals having random crystallographic orientation with molten metal.

39. A method as set forth in claim 38 wherein said step of growing only one crystal of metal from the selector passage into the article mold cavity includes growing a crystal of metal having a primary orientation axis extending parallel to a selected primary orientation axis of the single crystal article and a secondary orientation axis which is within plus or minus 30 degrees of being parallel to a selected secondary orientation axis into the article mold cavity.

40. A method as set forth in claim 31 wherein said step of growing one or more crystals along a downwardly sloping portion of the selector passage includes growing a first crystal of metal having a secondary orientation axis which is disposed at a first angle to a vertical plane containing a selected secondary orientation axis of the single crystal article, growing a second crystal of metal having a secondary orientation axis which is disposed at a second angle to the vertical plane containing the selected secondary orientation axis of the single crystal article, said second angle being greater than said first angle, and crowding out the second crystal with the first crystal by growing the first crystal at a greater rate than the second crystal.

41. A method as set forth in claim 31 wherein said step of growing one or more crystals along an upwardly extending portion of the selector passage includes growing at least one crystal along an arcuate bend portion of the selector passage.

42. A mold structure comprising a plurality of article molds disposed in a circular array, each of said article molds including mold means for defining an article mold cavity having a configuration corresponding to the configuration of an article to be cast, starter means for defining a starter cavity in which molten metal solidifies as a plurality of crystals, and selector means extending between an upper end portion of said starter means and a lower end portion of said article mold means for at least partially defining a crystal selector passage which extends between said starter cavity and said article mold cavity and from which a single crystal of metal solidifies upwardly into said article mold cavity, said selector means including a lower section connected with said starter means and in which a lower portion of said selector passage extends away from said starter cavity, an upper section connected with said article mold means and in which an upper portion of said selector passage extends downwardly away from said article mold cavity and a connector section connected with said upper and lower sections of said selector means and in which a connector portion of said selector passage extends between said upper and lower portions of said selector passage, said connector portion of said selector passage of each one of said article molds includes a portion which slopes downwardly in the direction of solidification of metal along said selector passage, said starter means of each of said article molds of said mold structure having a vertical central axis which is disposed in a vertical radial plane extending radially from the center of the circular array of article molds, said connector portion of said selector passage of each one of said article molds having a single bend portion disposed to one side of the vertical radial plane in which the vertical central axis of said starter means of said one of said article molds is disposed.

43. A mold structure as set forth in claim 42 wherein said single bend portion of said selector passage of each one of said article molds has a longitudinal central axis which is disposed in a vertical plane extending transversely to the vertical radial plane in which the vertical central axis of said starter means of said one of said article molds is disposed.

44. A mold structure as set forth in claim 42 wherein said single bend portion of said selector passage of each one of said article molds has a longitudinal axis which is disposed in a plane extending perpendicular to the radial plane in which the vertical central axis of said starter means of said one of said article molds is disposed.

45. A mold structure comprising a plurality of article molds disposed in a circular array, each of said article molds including mold means for defining an article mold cavity having a configuration corresponding to the configuration of an article to be cast, starter means for defining a starter cavity in which molten metal solidifies as a plurality of crystals, and selector means extending between an upper end portion of said starter means and a lower end portion of said article mold means for at least partially defining a crystal selector passage which extends between said starter cavity and said article mold cavity and from which a single crystal of metal solidifies upwardly into said article mold cavity, said selector means including a lower section connected with said starter means and in which a lower portion of said selector passage extends away from said starter cavity, an upper section connected with said article mold means and in which an upper portion of said selector passage extends downwardly away from said article mold cavity and a connector section connected with said upper and lower sections of said selector means and in which a connector portion of said selector passage extends between said upper and lower portions of said selector passage, said starter means of each of said article molds of said mold structure having a vertical central axis which is disposed in a vertical radial plane extending radially from the center of the circular array of article molds, said connector portion of said selector passage of each one of said article molds having a single bend portion which extends to one side of the vertical radial plane in which the vertical central axis of said starter means of said one of said article molds is disposed, said single bend portion of said selector passage of each one of said article molds having a longitudinal central axis which is disposed in a vertical plane extending transversely to the vertical radial plane in which the vertical central axis of said starter means of said one of said article molds is disposed, said single bend portion of said selector passage of each one of said article molds includes a portion which slopes downwardly in the direction of solidification of metal along said selector passage.

46. A mold structure as set forth in claim 45 wherein the vertical plane in which the longitudinal central axis of said single bend portion of said selector passage of each one of said article molds is disposed extends perpendicular to the radial plane in which the vertical central axis of said starter means of said one of said article molds is disposed.

47. A mold comprising a plurality of article molds disposed in a circular array with vertical radial planes extending radially from the center of the circular array of article molds, each of the radial planes extending through one of said article molds, each of said article molds including article mold means for defining an article mold cavity which extends through one of the vertical radial planes and has a configuration corresponding to the configuration of an article to be cast, starter means for defining a starter cavity which extends through the one of the vertical radial planes through which the article mold cavity of the same article mold extends and in which molten metal solidifies, and selector means extending between an upper end portion of said starter means and a lower end portion of said article mold means for at least partially defining a crystal selector passage which extends between said starter cavity and said article mold cavity and from which a single crystal of metal solidifies upwardly into said article mold cavity, said selector means including a lower section connected with said starter means and in which a lower portion of said selector passage extends away from said starter cavity, an upper section connected with said article mold means and in which an upper portion of said selector passage extends away from said article mold cavity, and a connector section connected with said upper and lower sections, said connector section including an entry section in which an entry portion of said selector passage extends away from said lower portion of said selector passage, a single bend section in which a single bend portion of said selector passage extends away from said entry portion of said selector passage, said single bend portion of said selector passage being entirely disposed to one side of the one of the vertical radial planes through which the article mold cavity and starter cavity connected with the single bend portion extend, and an exit section in which an exit portion of said selector passage extends away from said single bend portion of said selector passage, said entry and exit portions of said selector passage having longitudinal central axes which extend through the one of the vertical radial planes through which the article mold cavity and starter cavity connected with said entry and exit portions of said selector passage extend, said entry portion, single bend portion, and exit portion of said selector passage have longitudinal central axes which are disposed in a single vertical plane extending transversely to the one of the vertical radial planes through which the article mold cavity and starter cavity connected with said entry and exit portions of said selector passage extend, said entry portion of said selector passage sloping downwardly away from an upper end of said lower portion of said selector passage.

48. A mold structure as set forth in claim 47 wherein the single vertical plane in which the longitudinal central axes of said entry portion, single bend portion, and exit portion of said selector passage are disposed extends perpendicular to the one of the vertical radial planes through which the longitudinal central axes of the article mold cavity and starter cavity connected with said entry and exit portions of said selector passage extend.

* * * * *

UNITED STATES PATENT AND TRADEMARK OFFICE
CERTIFICATE OF CORRECTION

PATENT NO.  : 5,062,468
DATED       : November 5, 1991
INVENTOR(S) : Louis H. Monte, et al.

It is certified that error appears in the above-identified patent and that said Letters Patent is hereby corrected as shown below:

Column 31, Line 29, Claim 30, change "downwardly" to --upwardly--.

Signed and Sealed this

Twenty-third Day of March, 1993

Attest:

STEPHEN G. KUNIN

*Attesting Officer*   Acting Commissioner of Patents and Trademarks